US007660081B2

(12) United States Patent
Daughton et al.

(10) Patent No.: US 7,660,081 B2
(45) Date of Patent: Feb. 9, 2010

(54) SUPERPARAMAGNETIC PLATELETS FIELD SENSING DEVICES

(75) Inventors: James M. Daughton, Eden Prairie, MN (US); Dexin Wang, Eden Prairie, MN (US)

(73) Assignee: NVE Corporation, Eden Prairie, MN (US)

( * ) Notice: Subject to any disclaimer, the term of this patent is extended or adjusted under 35 U.S.C. 154(b) by 0 days.

(21) Appl. No.: 12/011,545

(22) Filed: Jan. 28, 2008

(65) Prior Publication Data
US 2008/0123222 A1   May 29, 2008

Related U.S. Application Data

(62) Division of application No. 11/359,743, filed on Feb. 22, 2006, now Pat. No. 7,355,822, which is a division of application No. 10/394,799, filed on Mar. 21, 2003, now Pat. No. 7,054,118.

(60) Provisional application No. 60/367,761, filed on Mar. 28, 2002.

(51) Int. Cl.
*G11B 5/127*     (2006.01)
*G11B 5/39*      (2006.01)
(52) U.S. Cl. .................. 360/324; 360/342.2; 428/811.2
(58) Field of Classification Search ...... 360/324–324.2; 428/811.2, 811.3
See application file for complete search history.

(56) References Cited

U.S. PATENT DOCUMENTS 5,801,984 A * 9/1998 Parkin ..................... 365/158
6,064,552 A * 5/2000 Iwasaki et al. ............ 360/322
6,088,195 A * 7/2000 Kamiguchi et al. .... 360/324.12
6,111,722 A * 8/2000 Fukuzawa et al. ...... 360/324.12
6,166,948 A * 12/2000 Parkin et al. ............ 365/173
6,400,536 B1 * 6/2002 Gill ..................... 360/324.12
6,544,801 B1 * 4/2003 Slaughter et al. ............ 438/3
6,633,461 B2 * 10/2003 Gill ........................ 360/314
6,654,212 B2 * 11/2003 Hayakawa .............. 360/324.2
6,728,132 B2 * 4/2004 Deak ..................... 365/173
6,868,003 B2 * 3/2005 Kang et al. ............... 365/171
7,390,584 B2 * 6/2008 Daughton et al. ........ 428/811.2

OTHER PUBLICATIONS

Giant Magnetoresistance at Low Fields in Discontinuous NiFe-Ag Multilayer Thin Films; T. L. Hylton, K. R. Coffey, M. A. Parker and J. K. Howard; Science, New Series, vol. 261, No. 5124 (Aug. 20, 1993), pp. 1021-1024.*
Giant Magnetoresistance Materials and their Potential As Read Head Sensors; Robert L. White; IEEE Transactions on Magnetics, vol. 30, No. 2, Mar. 1994, pp. 346-352.*
Rodmacq et al., Magnetoresistive properties and thermal stability of Ni-Fe/Ag multilayers, Journal of Magnetism and Magnetic Materials, 118(1993) L11-L16.
Pool, Magnetic Films Get Sensitivity Training, Science, New Series, vol. 261, No. 5124, Aug. 20, 1993, p. 984.

* cited by examiner

*Primary Examiner*—Brian E Miller
(74) *Attorney, Agent, or Firm*—Kinney & Lange, P.A.

(57) ABSTRACT

A ferromagnetic thin-film based magnetic field sensor having an electrically insulative intermediate layer with two major surfaces on opposite sides thereof with an initial film of an anisotropic ferromagnetic material on one of those intermediate layer major surfaces and thin-film platelets on the remaining one of the intermediate layer major surfaces.

18 Claims, 12 Drawing Sheets

US 7,660,081 B2

SUPERPARAMAGNETIC PLATELETS FIELD SENSING DEVICES

CROSS-REFERENCE TO RELATED APPLICATIONS

This application is a divisional of application Ser. No. 11/359,743 filed Feb. 22, 2006 for "SUPERPARAMAGNETIC FIELD SENSING DEVICES" which is a divisional of application Ser. No. 10/394,799, filed Mar. 21, 2003 for "SUPERPARAMAGNETIC DEVICES" which claims the benefit of Provisional Application No. 60/367,761 filed Mar. 26, 2002 for "SUPERPARAMAGNETIC MATERIALS IN MAGNETIC DEVICES" as does this application.

STATEMENT OF GOVERNMENT INTEREST

This invention was made with Government support under Contract Number DTRA01-99-C-0110 awarded by the Defense Threat Reduction Agency. The Government has certain rights in this invention.

BACKGROUND

The present invention relates to ferromagnetic thin-film structures and, more particularly, to ferromagnetic thin-film structures exhibiting relatively large magnetoresistive characteristics.

Many kinds of electronic systems make use of magnetic material based devices. Digital memories are used extensively in digital systems of many kinds including computers and computer systems components, and digital signal processing systems. Such memories can be advantageously based on the storage of digital bits as alternative states of magnetization in magnetic materials in each memory cell, particularly in cells using thin-film magnetic materials, resulting in memories which use less electrical power and do not lose information upon removals of such electrical power.

Magnetometers and other magnetic sensing devices are also used extensively in many kinds of systems including magnetic disk memories and magnetic tape storage systems of various kinds. Such devices provide output signals representing the magnetic fields sensed thereby in a variety of situations.

Such memory cells and sensors can often be advantageously fabricated using ferromagnetic thin-film materials, and are often based on magnetoresistive sensing of magnetic states, or magnetic conditions, therein. Such devices may be provided on a surface of a monolithic integrated circuit to provide convenient electrical interconnections between the device and the operating circuitry therefor.

In the recent past, reducing the thicknesses of the ferromagnetic thin-films and the intermediate layers in extended "sandwich" structures in which the two major surfaces of the intermediate layer each have thereon an anisotropic ferromagnetic thin-film layer, including those having additional alternating ones of such films and layers, i.e. superlattices, have been shown to lead to a "giant magnetoresistive effect" being present. This effect yields a magnetoresistive response which can be in the range of and order of magnitude or more greater than that due to the well-known anisotropic magnetoresistive response.

In the ordinary anisotropic magnetoresistive response, varying differences between the direction of the magnetization vector in the ferromagnetic film and the direction of the sensing current passed through the film lead to varying differences in the effective electrical resistance in the direction of the current. The maximum electrical resistance occurs when the magnetization vector in the film and the current direction are parallel to one another or antiparallel, while the minimum resistance occurs when they are perpendicular to one another. The total electrical resistance in such a magnetoresistive ferromagnetic film can be shown to be given by a constant value, representing the minimum resistance, plus an additional value depending on the angle between the current direction in the film and the magnetization vector therein. This additional resistance follows a square of the cosine of that angle.

As a result, operating external magnetic fields can be used to vary the angle of the magnetization vector in such a film portion with respect to the easy axis of that film portion. Such an easy axis comes about because of an anisotropy present in the film typically resulting from depositing that film in the presence of a fabrication external magnetic field oriented in the plane of the film along the direction desired for the easy axis in the resulting film or annealing such a film afterward in the presence of such a field. During subsequent operation of the device with the resulting film, such operating external magnetic fields can vary the angle to such an extent as to cause switching of the film magnetization vector between two stable states which occur as magnetizations oriented in opposite directions along that easy axis. The state of the magnetization vector in such a film portion can be measured, or sensed, by the change in resistance encountered by current directed through this film portion. This arrangement has provided the basis for a ferromagnetic, magnetoresistive anisotropic thin film to serve as part of a memory cell.

In contrast to this arrangement, the resistance in the plane of a ferromagnetic thin-film is isotropic with respect to the giant magnetoresistive effect rather than depending on the direction of a sensing current therethrough as for the anisotropic magnetoresistive effect. The giant magnetoresistive effect has a magnetization dependent component of resistance that varies as the cosine of the angle between magnetizations in the two ferromagnetic thin-films on either side of an intermediate layer. In the giant magnetoresistive effect, the electrical resistance through the "sandwich" or superlattice is lower if the magnetizations in the two separated ferromagnetic thin-films are parallel than it is if these magnetizations are antiparallel, i.e. directed in opposing directions. Further, the also present anisotropic magnetoresistive effect in very thin-films is considerably reduced from the bulk values therefor in thicker films due to surface scattering, whereas very thin films are a fundamental requirement to obtain a significant giant magnetoresistive effect.

In addition, as indicated, the giant magnetoresistive effect can be increased by adding further alternate intermediate and ferromagnetic thin-film layers to extend the "sandwich" or superlattice structure. The giant magnetoresistive effect is sometimes called the "spin valve effect" in view of the explanation that a larger fraction of conduction electrons are allowed to move more freely from one ferromagnetic thin-film layer to another if the magnetizations in these layers are parallel than if they are antiparallel with the result that the magnetization states, of the layers act as sort of a valve.

These magnetizations results often come about because of magnetic exchange coupling between the ferromagnetic thin-films separated by the intermediate layers, these intermediate layers typically formed from a nonferromagnetic transition metal as an electrical conductor. The effect of the exchange coupling between the ferromagnetic thin-film layers is determined to a substantial degree by the thickness of such an intermediate layer therebetween. The effect of the coupling between the separated ferromagnetic thin-film layers has been found to oscillate as a function of this separation thickness between these layers in being ferromagnetic coupling (such that the magnetizations of the separated layers are parallel to one another) and antiferromagnetic coupling (such that the magnetizations of the separated layers are opposed to one another, or antiparallel to one another). Thus, for some separation thicknesses, the layer coupling can be of zero value between extremes of such oscillations.

Exhibiting the giant magnetoresistive effect in a superlattice structure, or in an abbreviated superlattice structure formed by a three layer "sandwich" structure, requires that there be arrangements in connection therewith that permit the establishment alternatively of both parallel and antiparallel orientations of the magnetizations in the alternate ferromagnetic thin-film layers therein. One such arrangement is to have the separated ferromagnetic thin-films in the multilayer structure be antiferromagnetically coupled but to a sufficiently small degree so that the coupling field can be overcome by an external magnetic field.

Another arrangement is to form the ferromagnetic thin-film layers-with-alternating high and low coercivity materials so that the magnetization of the low coercivity material layers can be reversed without reversing the magnetizations of the others. A further alternative arrangement is to provide "soft" ferromagnetic thin-films and exchange couple every other one of them with an adjacent magnetically hard layer (forming a ferromagnetic thin-film double layer) so that the ferromagnetic double layer will be relatively unaffected by externally applied magnetic fields even though the magnetizations of the other ferromagnetic thin-film layers will be subject to being controlled by such an external field.

One further alternative arrangement, related to the first, is to provide such a multilayer structure that is, however, etched into strips such that demagnetizing effects and currents in such a strip can be used to orient the magnetizations antiparallel, and so that externally applied magnetic fields can orient the magnetizations parallel. Thus, parallel and antiparallel magnetizations can be established in the ferromagnetic thin-films of the structure as desired in a particular use. Such a structure must be fabricated so that any ferromagnetic or antiferromagnetic coupling between separated ferromagnetic films is not too strong so as to prevent such establishments of film magnetizations using practical interconnection arrangements.

A magnetic field sensor suited for fabrication with dimensions of a few microns or less can be fabricated that provides a suitable response to the presence of very small external magnetic fields and low power dissipation by substituting an electrical insulator for a conductor in the nonmagnetic intermediate layer. This sensor can be fabricated using ferromagnetic thin-film materials of similar or different kinds in each of the outer magnetic films provided in a "sandwich" structure on either side of an intermediate nonmagnetic layer which ferromagnetic films may be composite films, but this insulating intermediate nonmagnetic layer permits electrical current to effectively pass therethrough based primarily on a quantum electrodynamic effect resulting in a "tunneling" current.

This "tunneling" current has a magnitude dependence on the angle between the magnetization vectors in each of the ferromagnetic layers on either side of the intermediate layer due to the transmission barrier provided by this intermediate layer depending on the degree of matching of the spin polarizations of the electrons tunneling therethrough with the spin polarizations of the conduction electrons in the ferromagnetic layers, the latter being set by the layer magnetization directions to provide a "magnetic valve effect". Such an effect results in an effective resistances or conductance, characterizing this intermediate layer with respect to the "tunneling" current therethrough. The maximum fractional change in effective resistance is a function of the magnetic polarization of the conduction electrons given by $$(\Delta R/R) = 2P_1 P_2/(1-P_1 P_2)$$

where $P_1$ and $P_2$ are the conduction electron spin polarizations of the two ferromagnetic layers. These polarizations appear dependent on the ratio of spin up to spin down electrons in the 3D shell of the transition elements used in the ferromagnetic thin-film's, i.e. the spin polarization P of the conduction electrons. The fraction f of 3D electrons which are spin up have typical values of 0.75 for iron, 0.64 for cobalt and 0.56 for nickel. Conduction electrons in metals are normally S shell electrons which theoretically would be equally divided between spin up and spin down electrons. However, because of band splitting the conduction electrons in the magnetic layers are assumed to have a fraction of spin up electrons like that of the electrons in the 3D shell. The spin polarization is then determined from $P=2f-1$.

In addition, shape anisotropy is often used in such a sensor to provide different coercivities in the two ferromagnetic layers, and by forming one of the ferromagnetic layers to be thicker than the other. Such devices may be provided on a surface of a monolithic integrated circuit to thereby allow providing convenient electrical connections between each such sensor device and the operating circuitry therefor.

A "sandwich" structure for such a spin dependent tunneling sensor, based on having an intermediate thin layer of a nonmagnetic, dielectric separating material with two major surfaces on each of which an anisotropic ferromagnetic thin-film is positioned, exhibits the "magnetic valve effect" if the materials for the ferromagnetic thin-films and the intermediate layers are properly selected and have sufficiently small thicknesses. The resulting "magnetic valve effect" can yield a response which can be several times in magnitude greater than that due to the "giant magnetoresistive effect" in a similar sized sensor structure.

The current-voltage characteristics of such "sandwich" structure sensors will exhibit a relatively linear change in the quantum electrodynamic effect "tunneling" current therethrough from one ferromagnetic layer through the barrier to the other with respect to the voltage provided across the sensor, i.e. across the barrier layer between these ferromagnetic layers, for relatively lower value voltages; but the current magnitude increases more than linearly for higher values of voltage across the sensor. As the voltage across the sensor increases, the fractional change in the "tunneling" current through the sensor, for the ferromagnetic layers having magnetizations changing from parallel to one another to antiparallel, decreases to being only half as great with several hundred millivolts across the sensor as occurs in the situation with a hundred or less millivolts across the sensor so that this fractional change with sensor voltage will range from a few percent to 20% or more. The fractional change in the resistance of the sensor for the ferromagnetic layers having magnetizations changing from parallel to one another to antiparallel increases to about one and one-half the room temperature values when the sensor is cooled to 77° K., but the "tunneling" current through the sensor increases by only about 10% to 20% indicating that the effective resistivity of the sensor is relatively insensitive to temperature (around 500 to 1000 ppm/° C.).

The effective resistivity of such a spin dependent tunneling sensor is set by the amount of "tunneling" current through the cell permitted by the barrier layer for the voltage across the sensor. The high sensitivity of the "tunneling" current to the thickness of the barrier layer leads to a wide range of sensor resistivities which have been observed to be from 60.0Ω-μm$^2$ to 10,000 MΩ-μm$^2$. On the other hand, the barrier layer appears to permit relatively little magnetic coupling between the ferromagnetic layers thereacross with the coupling fields typically being only a few Oe.

The barrier material used for such sensing devices has typically been aluminum oxide, $Al_2O_3$ and other such oxides, but other dielectric materials have been used. A typical construction therefor has had two rectangular ferromagnetic thin-film strips with the barrier layer therebetween such that the long axis of the bottom strip, supported directly on an electrically insulating substrate, is at some angle with respect to that of the upper strip supported thereon through the barrier layer. This arrangement leaves the crossover area where these ferromagnetic strips overlap having the shape of a parallelograms defining the portion of the barrier layer through which there is effective current tunneling between the strips.

These devices are fabricated using semiconductor based integrated circuit chip fabrication techniques having a junction structure in a sensor cell based on a nonmagnetic intermediate separating material with two major surfaces on one of which is a base anisotropic ferromagnetic thin-film, which is also on or is a base electrode, and on the other of which there is at least one or possibly a plurality of separate anisotropic ferromagnetic thin-films but typically of differing effective coercivity with respect to the base film. The nonmagnetic intermediate separating material is an insulator for a spin dependent-tunneling device and is typically $Al_2O_3$. Ones of the plurality of similar structures formed of separated ferromagnetic films can be interconnected to one another. The base electrode and the separated films can have lengths with gradually narrowing widths toward each end which narrow to zero at the ends. The intermediate material supported on a single base electrode can be common to all of these separated films thereon. The ferromagnetic layers in these structures are typically simple single films of Fe, Co, NiFe or other common ferromagnetic alloys.

The operating current for such sensors is typically supplied through a pair of current leads with one such lead connected to an end of the upper strip and the other lead connected to an end of the lower strip. The effective electrical resistance of the sensor is determined from measuring the voltage across the tunnel junction at two voltage leads each connected to one of the remaining two ends of these strips. Then, by providing a current of a known fixed value through the current leads and measuring the corresponding tunnel junction voltage on the voltage leads, the effective resistance can be simply calculated by dividing the measured voltage value by the chosen fixed current value.

As indicated above, the measured resistance of the tunnel junction in such a sensor is a function of the relative orientation of the magnetizations of the two ferromagnetic thin-film metal strips. The portion of the tunnel junction resistance that is subject to change as a result of that junction experiencing changes in external magnetic fields to which it is exposed is termed junction magnetoresistance (often written JMR, and defined as $\Delta R/R_{min}$ but is equivalently $\Delta V/V_{min}$ for voltage measurements with a fixed current with either being expressed as a percentage). The sensors described above demonstrated that the JMR therefor can be quite large at room temperature (=10 to 60%).

Often more than one such magnetic field sensor is used in a sensing configuration to provide a larger output signal and, in many instances, to provide some sensor noise cancellation. These goals are many times pursued through use of a bridge circuit in which such giant magnetoresistive effect structures or spin dependent tunneling structures are provided as circuit resistors connected in two parallel branches between two power supply nodes with each such branch having two such resistors in series with one another. A single polarity voltage source is typically connected between the two power supply nodes with in many instances the negative side of the source being grounded. A signal sensing differential amplifier with a pair of inputs is typically electrically connected between the two bridge circuit output nodes, i.e. the internal nodes of each of the two branches which for each is the node between the two resistors connected in series therein.

To have such a bridge circuit operate properly, adjacent ones of the magnetoresistors in the circuit must vary in resistance differently under an applied magnetic field if a signal output is to result. If they each have the same resistance variation, there will be a zero value signal developed between the bridge circuit output nodes, i.e. between the sensing amplifier inputs. Since an externally applied magnetic field to be sensed will be approximately the same for each of the closely spaced resistors in the bridge circuit, design, measures are necessary to assure the needed resistive differences nevertheless occur between the adjacent circuit structures or resistors. One such measure previously used has been to place two of these magnetoresistors on opposite sides of the bridge circuit each connected to different power supply terminals under a magnetic shield leaving only the other two such resistors exposed to the effects of externally applied magnetic fields. Such an arrangement, however, allows determining the magnitude of an externally applied magnetic field in only one direction. Another such sensor must be provided to sense another field component.

A further variation of such a spin dependent tunneling sensor has the magnetization direction of one of the ferromagnetic layers on one side of the barrier layer pinned by an antiferromagnetic material layer provided thereon to thereby have its magnetization direction fixed relative to the remainder of the sensor as long as the magnitude of any external applied magnetic field is less than several times the maximum external field intended to be sensed. Again, the electrical resistance of the junction depends on the relative magnetization orientations of the two ferromagnetic layers with the resistance being low when the two magnetizations are parallel, and high when they are antiparallel. Therefore, the pinned magnetization direction layer becomes a magnetization direction reference in setting a pinned direction, and the magnetization orientation response of the free ferromagnetic layer to externally applied magnetic fields is translated into a corresponding change in the junction resistance. An electrical signal is again obtained between electrodes on the two ferromagnetic layers in connection with this manipulating of the magnetization direction of the free layer through an externally applied magnetic field.

Semiconductor integrated circuit chip fabrication techniques are again used for fabrication typically providing an integrated circuit based on silicon as a substrate for the spin dependent tunneling device sensors in a wafer supporting such devices thereon to result in having a typical basic wafer layer structure of Si(integrated circuit substrate)-$Si_3N_4$(200)-$Ni_{65}Fe_{15}Co_{20}$(12.5)-$Al_2O_3$(15 or less)-$Fe_{60}Co_{40}$(5.0)-$Cr_{45}Pt_{10}Mn_{45}$(30) (in nm). The $Al_2O_3$ barrier is formed by depositing a layer of metallic Al then oxidizing it in the plasma of $Ar/O_2$. A magnetic field of 20 Oe is applied during deposition of the ferromagnetic layers to induce the desired easy axes therein in a direction parallel to the pinned direction maintained by the antiferromagnetic material $Cr_{45}Pt_{10}Mn_{45}$.

A typical resulting structure of a chip from such a wafer is shown in the layer diagram of FIG. 1 which is not a true cross section views in that many dimensions therein are exaggerated or reduced for purposes of clarity. Typically, such a spin dependent tunneling sensing structure is provided on a semiconductor chip, 10, having suitable operating circuitry for the sensor arrangement provided in the resulting monolithic integrated circuit structure. An electrical insulating layer, 11, is formed on semiconductor chip 10. A device conductivity enhancement base layer, 11', is then provided on insulating layer 11 followed with a ferromagnetic layer, 12, formed of permalloy (NiFeCo) being provided thereon so as together form the common bottom electrode with layer 12 serving as the device free magnetic layer in being relatively free to have its magnetization direction altered by externally applied magnetic fields. There may be a further ferromagnetic material layer, 13, provided in some form on layer 12 as part of the free magnetic layer such as a higher magnetic moment layer to enhance device performance at the barrier junction. An easy axis is provided for the common bottom electrode ferromagnetic layer 12, 13 typically parallel to the length of this structure though not necessarily so.

Thereafter, an intermediate or barrier layer, 14, of aluminum oxide ($Al_2O_3$) is provided on the common bottom electrode ferromagnetic layer 12, 13 which supports two corresponding separate top antiferromagnetic material and ferromagnetic material electrodes each of which is a separate pinned magnetization direction layer. Thus, all of these electrodes have to be of magnetic materials adjacent to the barrier that "sandwich" between the bottom and top ones of such the electrically insulating barrier layer.

Barrier layer 14 has two separate compound ferromagnetic thin-film layers thereon to form the two upper electrodes shown. These compound ferromagnetic thin-film layers are provided to have a net layer magnetization that, when fixed in orientation in the finally formed structure, will resist rotation from that orientation, and certainly resist firmly any rotation that could be sufficient to lead to a reversal in its orientation as a result of externally applied magnetic fields of up to 1000 Oe or more. These compound ferromagnetic thin-film layers are formed beginning with a ferromagnetic layer, 15, of cobalt iron (CoFe) alloy on first composite ferromagnetic layer 12,13. Then a nonmagnetic layer, 16, of ruthenium (rhenium or copper could alternatively be used) is provided on layer 15 as a Ru antiferromagnetic coupling layer. Thereafter, another ferromagnetic layer, 17, of CoFe is provided on layer 16 to complete a synthetic antiferromagnet 15, 16, 17 as the reference layer for each upper electrode. A further antiferromagnetic material "pinning" layer exhibiting a substantial magnetic anisotropy can (or must for best performance) be deposited on layer 17 to strongly set the magnetization direction of composite layer 15,16,17 in the direction in which the resulting sensor cell is intended to sense external magnetic fields during use as a sensor. Hence, a $Cr_{45}Pt_{10}Mn_{45}$ pinning layer, 18, is provided on layer 17 with a selected magnetization direction. Then, a layer of aluminum is provided on pinning layer 18 to passivate the upper electrode and to allow electrical connections thereto for circuit purposes. A further layer, 20, is provided on layer 19 to serve as an etching termination layer in connection with subsequent etching steps not described here. The resulting pinned or top electrodes, 21, are provided having an easy axis of the antiferromagnetic layer, and so the easy axes of the ferromagnetic thin-films in the compound layers in each of pinned electrodes 21 either perpendicular or parallel to the direction of the longest extent of those structures. This choice depends on the desired device characteristics and is made in conjunction with the direction chosen for the easy axis of the common bottom electrode ferromagnetic layer 12, 13 forming the bottom electrode, 22, along with device conductivity enhancement base layer 11☐. A tunnel junction structure, 23, comprises a base electrode 22 supporting a corresponding pinned electrode 21 separated therefrom by a corresponding barrier layer 14, with a base electrode 22 shown supporting two corresponding pinned electrodes 21 separated therefrom by a corresponding barrier layer 14 forming a sensor device.

Following the completion of sensor device structures 23, another layer of silicon nitride to form an insulating layer, 24. On insulating layer 24, a plurality of interconnections, 25, is provided for interconnecting sensor devices 23 and also for interconnecting them with electronic circuitry in the integrated circuits in semiconductor substrates 10 therebelow. Finally, a further insulating layer, 26, is provided over interconnections 25.

A typical tunnel junction magnetoresistive characteristic graph is given in FIG. 2 plotting magnetoresistance as a function of external magnetic fields applied along the easy axes of that pair of spin dependent tunneling junctions 23 having reference electrodes 21 supported on barrier layer 14 and common electrode 22 having the structure as specified above so that these fields are also applied parallel to the easy axis of composite free layer 12,13. The junction for the characteristic shown had an area of 130×280 µm², a resistance-area product of RAP=900 kΩ-µm² and a junction magnetoresistance of JMR=41.6%. There are clearly two separate magnetoresistance states near zero values of the externally applied magnetic field. These two states correspond to the parallel and antiparallel configurations of the free layer magnetization with respect to the pinned layer magnetization. The free layer magnetization is flips back and forth from parallel to antiparallel with slight changes in the value of the externally applied magnetic field.

Such a spin dependent tunneling sensing device can be given a more linear characteristic near zero value external applied magnetic fields by using a biasing magnetic field to force the free layer magnetization to initially be perpendicular to the free layer easy axis direction. When this "perpendicular bias" field is large enough to saturate the free layer magnetization in the perpendicular direction, the resistance vs. applied field characteristic becomes much more linear and has minimal hysteresis. The result is shown in FIG. 3. A bias current supplies a magnetic field perpendicular to this easy axis. The dotted line corresponds to a sensitivity of roughly 3%/Oe. The biasing uses >95% of the total power and causes the temperature to rise through self-heating. A major improvement on this situation would result if the linear low hysteresis output could be obtained without needing a perpendicular bias field.

A pinned reference layer spin dependent tunneling device sensor can also be operated in a bridge circuit, typically a bridge circuit having four bridge legs each based on such sensors and further having associated operating and output signal conditioning electronics (often provided in the substrate). Each bridge leg usually comprises multiple pinned reference layer spin dependent tunneling device sensors connected in series. Multiple spin dependent tunneling sensor pairs can be connected in series with pinned or upper electrode connected to the next common electrode to thereby increase the voltage range across the resulting sensor since each junction is best operated with about 0.1V of bias voltage provided thereacross. In simplest form, the electronic output signal conditioning circuit is formed by a comparator receiving as an input signal the output signal from the bridge circuit. In typically used circuits, there are often additional functions provided in the conditioning electronics such as amplification, feedback parallel and perpendicular biasing, filtering, chopping, stabilization, voltage modulation etc. depending on specific device applications.

As the minimum feature size in monolithic integrated circuit fabrication gets smaller through improving fabrication technology to thereby result in faster and denser devices, magnetic material portions in memory, sensing and other kinds of magnetic material based devices will become superparamagnetic (SPM) when the magnetic anisotropy energy is reduced to be comparable to the device thermal energy leading to possible spontaneous demagnetization or spontaneous changes in magnetic state. Thus, in most magnetic devices or operating structures, including magnetic recording media, magnetoresistive random access memories (MRAM), and many other devices, such superparamagnetism is an effect that is sought to be avoided.

However, superparamagnetic materials are unique in some of their properties including zero magnetic hysteresis and high sensitivity to externally applied magnetic fields. For any given magnetic material body with a volume V and an anisotropy constant K (anisotropy energy per unit volume), the total magnetic anisotropy energy is simply KV. In a 3-dimensional (3-D) superparamagnetic magnetic material body, meaning all of the body dimensions being of similar sizes, the magnetization of the body is highly sensitive to applied magnetic fields around zero field values although it takes a fairly large field to saturate the body due to shape anisotropy and fringe fields. For a pseudo 2-dimensional (2-D) superparamagnetic body with at least one body dimension being much smaller than the others, such as a thin-film, small extent platelet, on the other hand, the shape anisotropy and the fringe fields are minimal in the primary plane of the platelet body with respect to which the larger extent body dimensions are parallel thereby leading to a much lower in-plane saturation field than for a 3-D body. In this pseudo 2-D body situation, the in-plane body dimensions can be significantly larger than the platelet film thickness (for a true 2-D sample, this vertical dimension would be zero), as long as the KV value is comparable with the body thermal energy.

Even higher field sensitivity can be achieved in a pseudo 1-dimensional (1-D) superparagmagnetic magnetic material body having a relatively large body dimension in only one direction such as a magnetic material needle. A square shaped thin-film can also effectively be a pseudo 1-D superparamagnetic body if it has a uniaxial anisotropy in the film plane which limits the magnetization to be in one of the two orientations along the easy axis. The word "pseudo" will be assumed for the 2-D and 1-D bodies in the following description but not further used explicitly.

Superparamagnetic behavior has been observed in several single layer and multilayer NiFeCo material samples. The observed coercivity is at most a fraction of an Oe which is likely due to the hysteresis of the instrumentation. Just as important as low hysteresis, the material initial saturation field is very low. These are desirable characteristics for magnetic material layers in devices that have magnetizations that are relatively freely orientable. However, such layers to be useful in magnetic field sensing devices must maintain their superparamagnetic behavior and thus avoiding too great a thermal stability against spontaneous magnetic state changes. Thus, there is a desire to provide relatively free layers in magnetic field sensing devices exhibiting superparamagnetic behavior.

SUMMARY

The present invention provides a ferromagnetic thin-film based magnetic field sensor having an electrically insulative intermediate layer with two major surfaces on opposite sides thereof and an initial film of an anisotropic ferromagnetic material on one of those intermediate layer major surfaces. A superparamagnetic thin-film is on the remaining one of said intermediate layer major surfaces formed with an anisotropic ferromagnetic material having that product formed of its magnetic anisotropy energy constant and volume being less than twenty-five times that further product of its absolute temperature and Boltzmann's constant. This latter film has any magnetoresistance at no applied field being less than five percent of those values of magnetoresistance at the initial saturation point, and this film can be one of several ferromagnetic material films on that intermediate layer major surface each less than 20 Å thick with this same retentivity condition. The initial thin-film can be a fixed magnetization orientation film.

DETAILED DESCRIPTION

Figure 1:
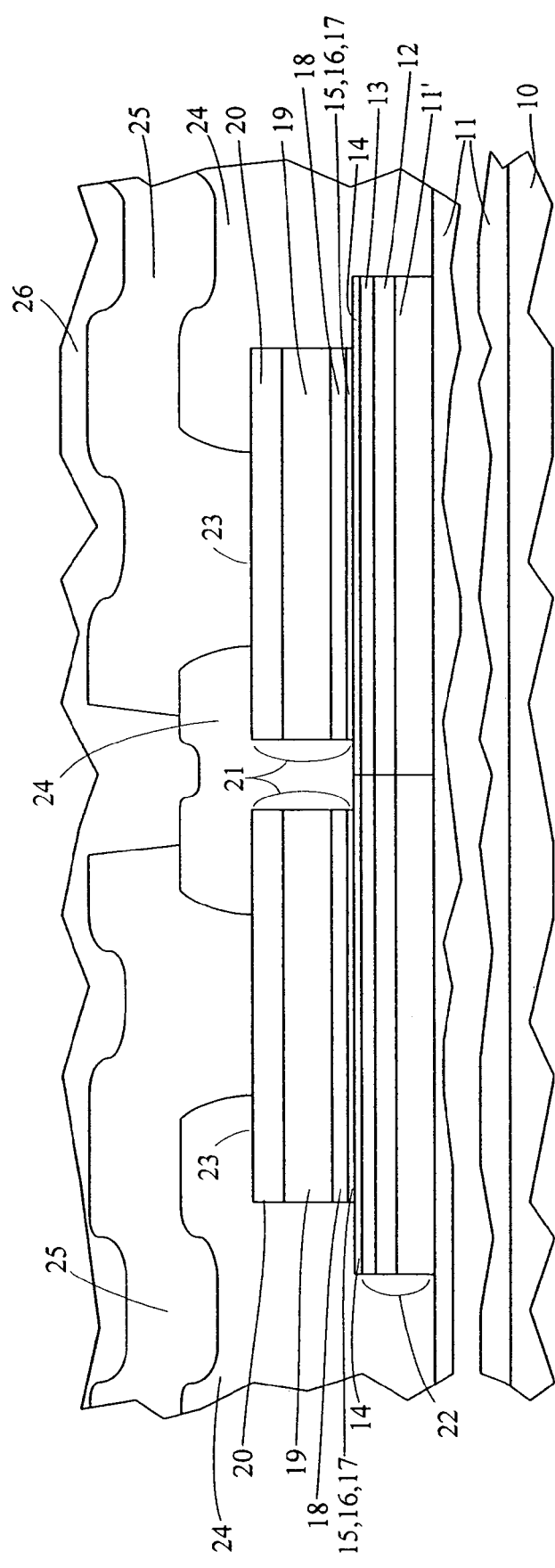
FIG. 1 shows a layer diagram of a spin dependent tunneling device formed in a monolithic integrated circuit with a silicon based monolithic integrated circuit portion serving as a device substrate.

2-D superparamagnetic bodies can be used as the magnetic material layers in spin dependent tunneling device sensors for magnetic field sensing that are layers which are relatively free to have their magnetization directions reoriented ("free layers"). A spin dependent tunneling device structure does not require a thick free magnetic layer to achieve a high magnetoresistive change ratio (the maximum magnetoresistive value change possible divided by the lowest absolute resistance value being the "MR or JMR ratio") as the result of being subjected to an externally applied-magnetic field change in contrast to "giant magnetoresistive effect" ("GMR") structures where such free magnetic layers need to be at least several nm to achieve the highest possible MR ratio. A magnetic layer of a few Angstroms thickness is enough to achieve the maximum MR or JMR ratio value for a spin dependent tunneling device. As will be described below, this thickness is the same as that needed for a practical superparamagnetic material layer. In actuality, superparamagnetic bodies made by sputtering will result in being bodies somewhere in between a true 1-D body and 3-D body. Therefore, the saturation field will be a non-zero, but small, value which value serves to limit the sensitivity to externally applied fields of a sensing device made using such a material layer.

Because of the characteristic traits of superparamagnetic materials, spin dependent tunneling devices using superparamagnetic materials as free layers will have a hysteresis free magnetization response to externally applied magnetic fields, will require no bias, and will have a resistance versus applied field characteristic that never changes after being subjected to any large excursions of externally applied magnetic fields of practical magnitudes such as those available from permanent magnets. The intrinsic high resistance of spin dependent tunneling devices in combination with the above mentioned zero bias requirement for a superparamagnetic free layer used therein offers a great opportunity to provide devices exhibiting ultra-low power consumption.

As with regular spin dependent tunneling devices, such devices with a superparamagnetic free layer used therein can be made relying upon microelectronic fabrication techniques to allow fast, efficient and economic production of large numbers of such devices especially when integrating the devices in integrated circuit chips to provide therein the conditioning electronics for such devices and their associated signals. The devices will be especially suitable for low applied external magnetic field and low electrical power devices such as magnetic medium detectors, nondestructive evaluation sensors, biomedical chip devices, and remote field sensors. One particularly suitable application is a solid state compass since there is no energy barrier to overcome which means smooth operation of the device to give true 360 degree operation.

A spin valve based GMR structure can also be constructed using 2-D superparamagnetic materials for the free layer therein to achieve high field sensitivity although MR ratio values therefor are smaller than for spin dependent tunneling devices. 3-D superparamagnetic layers can also be used in spin valve devices where a feedback mode of operation is preferred to utilize the most sensitive region at low fields.

The occurrence of superparamagnetism in a magnetic material body comes about for the dimensions of that body becoming so small that the ambient thermal energy is sufficient to cause the body magnetic moment to transition back and forth between two different stable orientations of the body magnetization set by the body anisotropy. The energy barrier between these two different magnetic states for the body is due to the effective anisotropy of the body. The transition rates depend on the body temperature and the body free energy with the energy difference between the states and the barrier being the primary determinant so that, following Boltzmann statistics, there is a strong exponential dependence on the ratio of the pertinent free energy to temperature.

Thus, the thermal relaxation of the system has a relaxation rate for spontaneous magnetization direction reversals therein which is governed by the relaxation time $\tau$ constant that is in this situation determined from the Arrhenius equation, $\tau=1/f_0 \exp(\Delta E/kT)$, where $f_0$ is the transition attempt frequency (~$10^9$ Hz) summarizing certain other energy and temperature details of the body, k is the Boltzmann constant, T is the Kelvin temperature, and $\Delta E$ is the anisotropy energy barrier between the two different stable free energy minima states. With a zero applied external magnetic field, $\Delta E=KV=\frac{1}{2} H_k M_s V$, where K is the body effective magnetic anisotropy energy constant, V is the magnetic material body volume, $H_k$ is the body magnetic anisotropy field, and Ms is the body saturation magnetization.

When $\Delta E/kT$ is sufficiently small at any given temperature T, the relaxation time $\tau$ becomes comparable to the measurement time and the magnetization orientation is unstable at that temperature. Thus a value for $\tau$ can be selected based on a length of time between magnetization reversals that will be arbitrarily considered long enough to represent body magnetic stability, and then the Arrhenius equation leads to the nominal superparamagnetic condition for a magnetic material body characterized by parameters K and V and T that $KV/kT < \ln(f_0\tau)$. If one assumes $\tau \approx 100$ s represents stability, the superparamagnetic condition becomes KV<25 kT. Because 100 seconds is on the long side for measurement time, selecting the energy barrier KV<25 kT sets the limit between superparamagnetism and the transition to stable magnetic behavior in the magnetic material body as is generally accepted. As an example, the critical size for superparamagnetic Co is about 76 Å in diameter for a Co sphere at room temperature with $\tau$ having a value of 100 seconds.

When the magnetic anisotropy energy KV is negligible compared with the Zeeman energy, $H_a M_s V$, of the magnetic particle moment $M_s V$ in an applied field Ha, then the normalized magnetization, $M/M_s$, can be approximated classically from the Brillouin function therefor by the Langevin function $L(a)=\coth(a)-1/a$, where $a=\mu H_a/kT$. Here $\mu=M_s V$ is the total magnetic moment of the particle, Ms is the saturation magnetization, and V the volume. For small externally applied magnetic fields $H_a$, the initial magnetic susceptibility $\chi_i$ is $\chi_i=M/H_a=M_s^2 V/3$ kT.

The above described situation is for 3-D magnetic material body superparamagnetism since the magnetization vector M can have any possible orientation in the 3-D volume of the body. Even higher field sensitivity is obtained in what are essentially 1-D and 2-D superparamagnetic particles because of the smaller number of degrees of freedom in such bodies than in a 3-D body, and the smaller demagnetization effects that occur therein than occur in 3-D particle assemblages. The thin ferromagnetic films as used in spin dependent tunneling devices are pseudo 2-D) structures that well approximate 2-D structures in their magnetization behavior because any out of plane of the film magnetization component would create an enormous demagnetization field ($4\pi M$) perpendicular to the film plane, and would thus be energetically unfavorable. Therefore, the magnetization of such a film is basically confined to be in the film plane to within a small fraction of a degree under normal externally applied operating magnetic fields. In contrast, the demagnetization field in the film plane is minimal because of the much larger extent of the film in lateral directions as compared to the thickness thereof.

Figure 4:
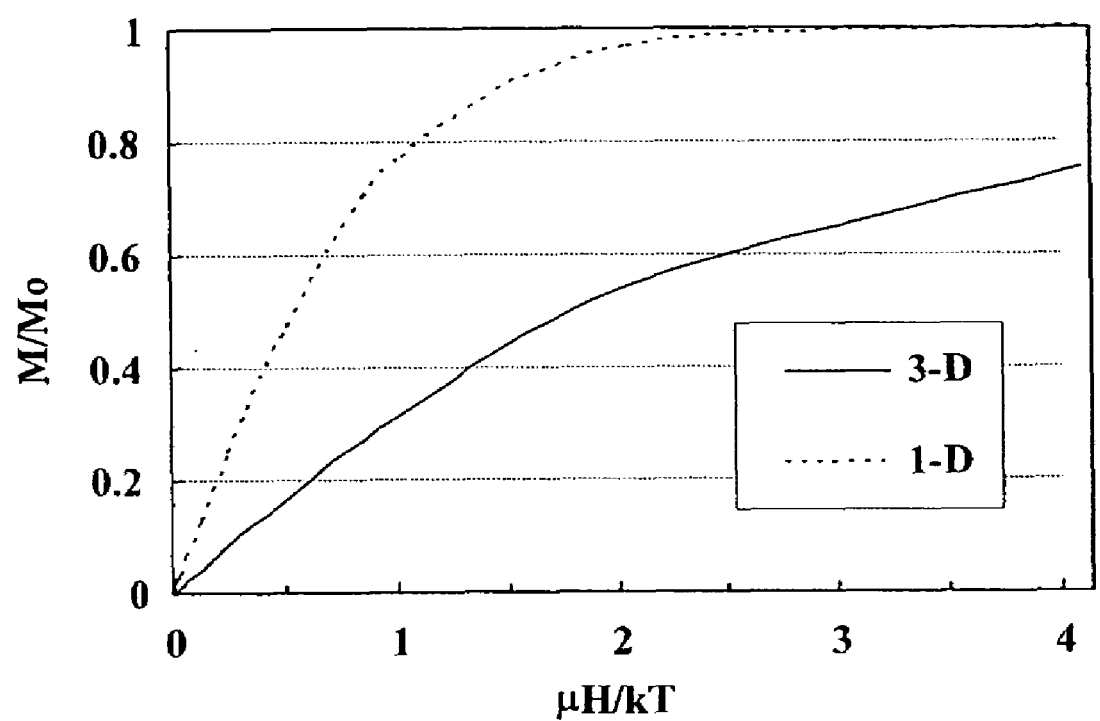
FIG. 4 shows a graph plotting two normalized magnetization functions versus a field and temperature parameter for 1-D and 3-D superparamagnetic materials.

In addition to the geometric restrictions to assure superparamagnetic behavior on the thin-film form of magnetic material bodies, in which form the body magnetization is restricted to being essentially in the film plane, there is also a field induced uniaxial anisotropy within the film plane that limits the body magnetization to being in one of two alternate directions along the body easy axis in the plane in zero externally applied magnetic fields. This type of body well approximates, and is the effective equivalent of, a "1-D" superparamagnetic body which are quantized to have only two magnetization directions. An equation to describe a 1-D superparamagnetic body can be reduced from the Brillouin function for normalized magnetization because of the corresponding limited total, atomic angular momentum involved to $M/M_s=\tanh(a)$ where $a=\mu H_a/kT$, a function similar to the Langevin function indicated above to be appropriate for a 3-D material situation. Both functions are plotted in FIG. 4. If the applied field $H_a$ is directed in the anisotropy or easy axis direction, then the initial susceptibility will be enhanced over the Langevin function. Actually for a 1-D body case when $KV/kT \gg 1$, the initial susceptibility is $\chi_i=3M_s^2V/3$ $kT=2(KV/kT)(M_s/H_k)$, where $H_k=2K/M_s$. This is 3 times the Langevin value. For the 2-D body case when $KV/kT \gg 1$, $\chi_i=(4/3)(KV/kT)(M_s/H_k)$, which is 2 times the Langevin value. The hard axis initial susceptibility for the 1-D body case is $M_s/H_k$. Since the susceptibility is inversely proportional to the temperature, for $KV/kT>\ln(f_0\tau)$, $\chi_i$ drops rapidly for all of the 1-D, 2-D and 3-D body cases indicating that the particles become larger than the superparamagnetic limit.

As apparent from the foregoing, the primary requirements for achieving high susceptibility are to have low dimension body superparamagnetism, to have a low effective magnetic anisotropy energy constant K (therefore a low $H_k$), and to have a high $KV/kT$ ratio but as limited by the superparamagnetism, condition: $KV/kT<\ln(f_0\tau)$. For the K value, all the crystalline, shape, and induced anisotropies must be considered, though shape anisotropy will be the dominant term for the regular soft magnetic materials used in the magnetic material based devices of interest. The higher the $KV/kT$ value, the higher the susceptibility, and so the field sensitivity, and the larger the $\tau$ will be according to the Arrhenius equation as long as it is still exhibiting superparamagnetic behavior for any given measurement requiring $KV<25$ kT.

The field sensitivity of an aligned 1-D superparamagnetic free layer in a pinned reference layer spin dependent tunneling device can be estimated using typical values. Assume $KV/kT=10$ for the superparamagnetic free layer film so that the relaxation time is then $\tau \approx 22$ μs according to the Arrhenius equation, a value which is fast enough for most low field sensing applications. Permalloy has $H_k \approx 3$ Oe for films of 10 nm thickness and less for thinner films. Since $\chi_i=M/H_a=(2KV/kT)(M_s/H_k)$ for a 1-D body, we know that $M=\chi_i H_a=(2KV/kT)(H_a/H_k)M_s$. For an externally applied magnetic field, Ha, directed along the magnetization direction of the pinned reference layer of $H_a=\pm 0.025 H_k=\pm 0.075$ Oe for permalloy, the resulting change in magnetization due to such an applied field is $\Delta M=(2)(0.5)M_s=M_s$.

The device tunneling current resistance, or tunneling magnetoresistance, is related to the free layer magnetization M by $R(M)=(\frac{1}{2})\{R_{min}+\Delta R_{max}(1-M/M_s)\}$. The resistance change between two arbitrary selected externally applied magnetic field values of $H_1$ and $H_2$ to provide a field change of $\Delta H_a$ is $\Delta R=R_2-R_1=(\frac{1}{2})$ $\{\Delta R_{max}[(M_1-M_2)/M_s]\}=(\frac{1}{2})$ $\{\Delta R_{max}[(-\Delta M)/M_s]\}=(\frac{1}{2})$ $\{\Delta R_{max}[-(M_s/M_s)]\}=-\frac{1}{2}$ $\Delta R_{max}$. The sensitivity in %/Oe is the percentage resistance change ratio, or the tunneling magnetoresistance, over the change in the externally applied magnetic field or $\Delta R/R_{min}/\Delta H_a=-\frac{1}{2}$ $\Delta/R_{min}/\Delta H_a$ and, for a typical spin dependent tunneling device, the tunneling magnetoresistance is typically 50%, so the sensitivity is $-\frac{1}{2}$ (50%)/(0.15 Oe)=$-167$%/Oe under a 0.15 Oe external field change. The minus sign means that the tunneling magnetoresistance decreases as the magnetization increases. This externally applied magnetic field sensitivity of 167%/Oe is 15 times higher than the highest field sensitivity achieved using a conventional spin dependent tunneling device with precision biasing.

In an actual device, the induced anisotropy is lower because a film of permalloy thinner than 10 nm is needed to exhibit superparamagnetic behavior, and KV/kT can be greater than 10, although a distribution of values of KV is likely for a real sample. These will make the field sensitivity even higher than the estimate above. However, some shape anisotropy may present depending on the aspect ratio of the pancake-shaped superparamagnetic material platelets. This shape anisotropy would likely reduce the field sensitivity.

A thin-film that is infinitesimally thin with in-plane uniaxial anisotropy is an ideal 1-D superparamagnetic material structure which offers the highest field sensitivity. For any real superparamagnetic material thin-film, the film thickness is not zero and its lateral dimension is not infinite to result in a situation somewhere between a true 1-D and a 3-D SPM material structure. As an example of a low dimension superparamagnetic material at room temperature, a thickness of three atomic layers of Co (about 7 Å) leads to a lateral maximum size of about 100 Å in diameter of a disc-shaped superparamagnetic material platelet of Co using the criteria of $KV=25$ kT. This lateral size is at least four orders of magnitude smaller in device area than that of existing devices.

The preparation of superparamagnetic free layer platelets often does not require patterning because the device reference layer across the barrier in a superparamagnetic spin dependent tunneling device need not be aligned to individual platelets in the free layer as it instead typically covers many of them. The preparation of the device reference layer does need patterning but requires only dimension precision on the order of microns that available with photomicrographic techniques.

The film thickness can be precisely controlled with an accuracy of <1 Å by controlling sputter deposition time. The controlling of lateral size to form superparamagnetic material platelets is also readily done by sputtering when the conditions are optimized due to the nature of island growth for many material and substrate combinations. The nonmagnetic grain boundaries decouple neighboring platelets when the magnetic layer is made thin and on appropriate buffer layers. This is actually one of the self-assembling techniques using island growth.

Another technique of forming uniform and controlled size free layer platelets is to use a buffer layer that has a well developed columnar structure. Magnetic layers will form on top of the columnar grains of the nonmagnetic buffer layer, but not around the columnar boundaries. This approach of sputtering magnetically isolated particulate films is universally used in magnetic media in hard disc drives, with $KV \gg 25$ kT as required for storage stability. Single layer superparamagnetic material films have been fabricated with Cu/NiFeCo/Cu structure.

Figure 5A:
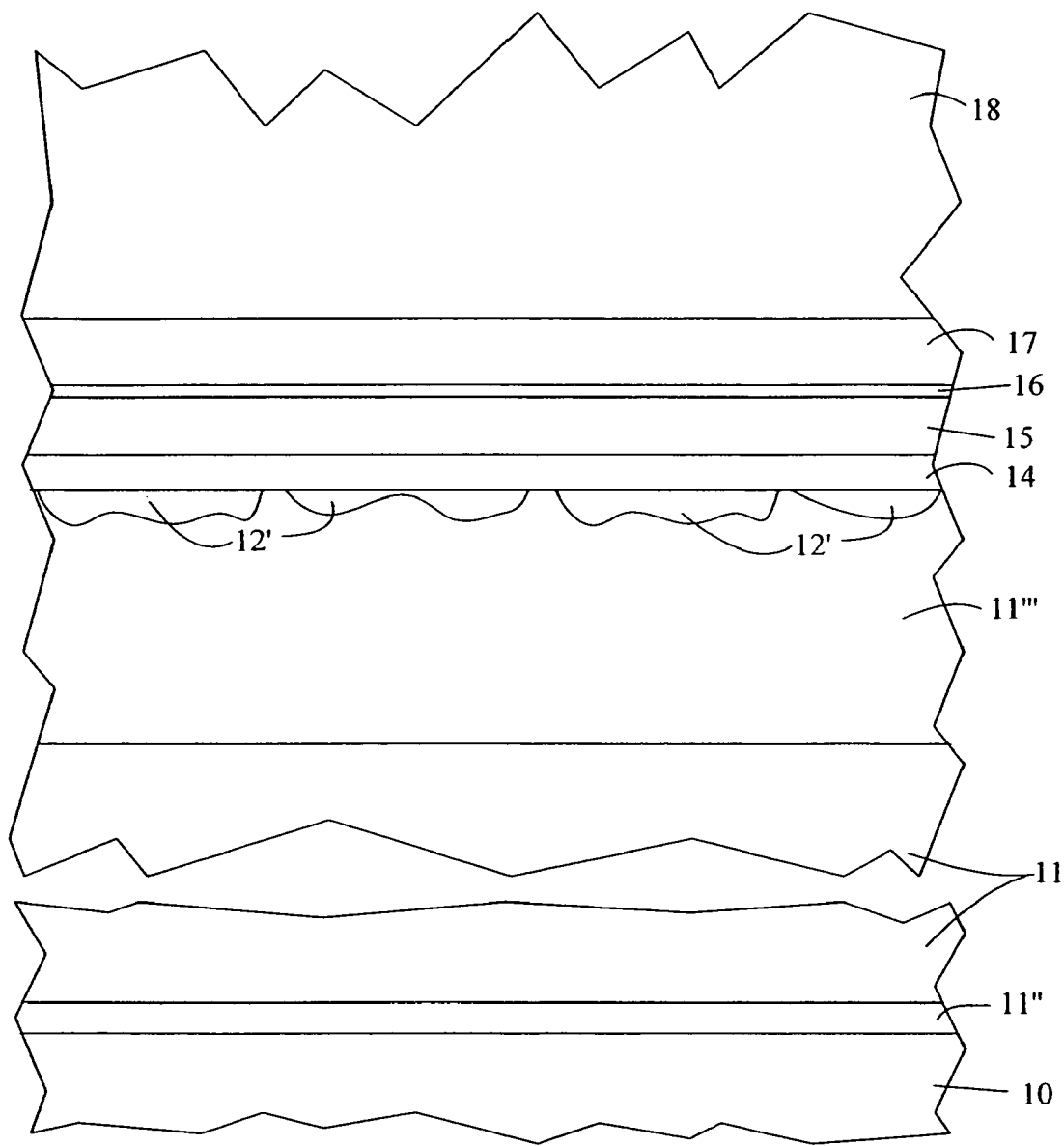
FIG. 5A shows a layer diagram of a portion of a device of the present invention.

Turning to the structure of a superparamagnetic spin dependent tunneling sensor, FIG. 5A shows a layer diagram of a portion of such a device on both sides of the barrier layer as supported by a monolithic integrated circuit wafer that is to a considerable extent like the spin dependent tunneling device of FIG. 1. Here too, FIG. 5A and the following two figures are not true cross section views in that many dimensions therein are exaggerated or reduced for purposes of clarity. The underlying substrate for the superparamagnetic spin dependent tunneling device is typically again a semiconductor material based monolithic integrated circuit chip 10, here as part of a monolithic integrated circuit wafer in fabrication, having just a top surface portion thereof shown that is the passivation layer for the wafer chips as such chips are typically passivated with about 500 nm of silicon dioxide or $SiO_2$. Substrate 10 typically has monolithic integrated circuit components integrated therein for operation of the sensing device supported thereon. Subsequently formed vias in the passivating $SiO_2$ connect such circuit components with these sensing devices to operate them and receive signals from them. Electrical insulating layer 11 is formed again on semiconductor wafer chip 10 but here is preceded by providing first a 50 nm tantalum nitride (TaN) etch-stop layer, 11", on the passivation layer surface of wafer chip 10. Thereafter, electrical insulating layer 11 is provided on this etch-stop layer as a 200 nm silicon nitride ($Si_3N_4$) layer both by sputter deposition. Together, chip 10, and layers 11" and 11, form an electrical insulating substrate that supports and provides a suitable surface for the superparamagnetic spin dependent tunneling devices next to be formed.

A ruthenium (Ru) layer is next provided on electrical insulating layer 11 to form a buffer nonmagnetic but electrically conducting layer, 11''', for the bottom electrode of the superparamagnetic spin dependent tunneling devices, and NiFeCo is provided thereon to form the free magnetic layer superparamagnetic structures or platelets, 12'. Conducting buffer layer 11''' is needed to provide an interconnectable electrode for electric current to pass through in operating the sensor device, as well as providing a resulting surface polycrystalline grain structure suitable for providing the small and uniform size ferromagnetic material platelets required for superparamagnetic material "layer" 12'. These two layers are provided by RF sputter deposition, first the layer of Ru to a thickness of 8 nm followed by the "layer" of NiFeCo to a thickness of 1.3 nm with a composition of 65% nickel (Ni), 15% iron (Fe) and 20% cobalt (Co).

Figure 5B:
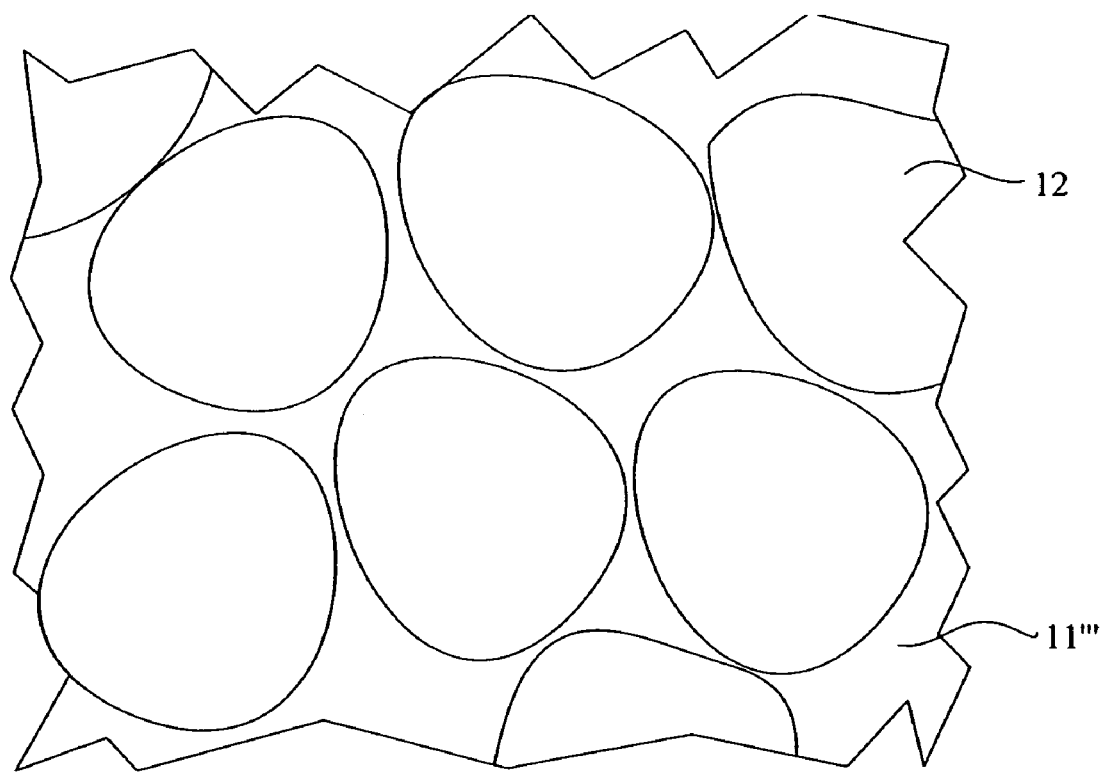
FIG. 5B shows a top view of a layer in the portion of the device of FIG. 5A.

The actual resulting magnetic material structure of the nominal 1.3 nm NiFeCo layer for forming superparamagnetic material "layer" 12' will not be a uniformly thick 1.3 nm layer because of the small time of deposition in providing such a thin layer. Instead, the effective magnetic thickness, effective magnetic anisotropy, and effective size of the platelets that do result are dependent on atomic-scale structure in and around each such NiFeCo platelet layer. The NiFeCo material initially deposits in clusters (as do all thin-films provided in material deposition processes). If this platelet layer deposition were continued for a longer time, the gaps between the clusters would fill in to thereby lead to having a resulting continuous ferromagnetic film. The size and location of the clusters is strongly influenced by the underlying Ru grain structure. In a very thin film of ferromagnetic material, there are also surface effects that can reduce or enhance the magnetic moment per unit volume of the surface layer of atoms. A ferromagnetic film in contact with a Pt or Pd layer, for instance, can induce ferromagnetism in the usually nonmagnetic material, while a ferromagnetic film in contact with Cu will experience a decrease in magnet moment per atom at the interface. As a consequence of these atomic-scale effects, the magnetic properties of very thin films can be substantially different from those of films that are tens of nm thick. FIG. 5B shows a top view of a portion of conducting buffer layer 11''' with the resulting platelets 12' distributed thereacross.

$Al_2O_3$ tunnel barrier layer 14 is next formed by sputter deposition of 1.2 nm thick layer of aluminum onto the exposed surface portions of layer 11''' and platelets 12'. After this deposition, the aluminum layer is oxidized in a plasma of $Ar/O_2$. The amount of oxygen in the sputter gas controls, in part, the oxygen content of the resulting $Al_2O_3$. The initially unoxidized aluminum layer expands by approximately 30% as a result of being oxidized.

A composite magnetically "hard" layer is next provided on top of tunnel barrier layer 14 as the basis for providing pinned reference layer upper electrodes. Compound ferromagnetic "hard" layer 15,16,17 is next provided on oxidized tunnel barrier layer 14 through further sputter deposition. This compound ferromagnetic thin-film layer is formed by sputter deposition beginning with depositing ferromagnetic layer 15 of CoFe comprising 40% cobalt and 60% iron to a thickness of 5 nm which is deposited in the presence of an easy axis direction determination magnetic field of 20 Oe which is aligned with the intended length of electrically conducting layer 11''' in the common bottom electrode (but could be alternatively aligned in the perpendicular direction in the plane of the layer depending on the device characteristics desired). Then nonmagnetic layer 16 of ruthenium (copper could alternatively be used) is sputter deposited (no orienting magnetic field needed in this instance) to provide a Ru antiferromagnetic coupling layer of 1 nm thickness. Thereafter, ferromagnetic layer 17 of CoFe, again comprising 40% cobalt and 60% iron, is deposited to a thickness of 5 nm and again in the presence of an easy axis direction determination magnetic field aligned as was the field for layer 15. This compound layer is relatively insensitive to externally applied fields and contributes little to the spatial fields thereabout (this advantage is given up by substituting a single 5 nm thick layer of Fe60Co40 in place of this compound layer as an alternative, simplified structure). However, the magnetization direction in this composite layer by itself is not very strongly fixed in any direction because of the relatively weak anisotropy exhibited by the CoFe layers.

Thus, a further antiferromagnetic material "pinning" layer exhibiting a substantial magnetic anisotropy must be deposited on layer 17 to strongly set the magnetization direction of compound layer 15,16,17 in the direction in which the resulting sensor cell is intended to sense external magnetic fields during use as a sensor to thereby complete the magnetically "hard" reference layer. Such a layer has a strongly fixed magnetization direction which, through exchange coupling to layer 17, strongly fixes the direction of magnetization of that layer also, and so that of layer 15 through Ru layer 16. The result is an antiferromagnetic layer coupled strongly to compound layer 15,16,17 which also provides a high magnetic inductance material layer, layer 15, with a corresponding substantial spin polarization against barrier layer 14. Hence, layer 18 of antiferromagnetic material $Cr_{45}Pt_{10}Mn_{45}$ is sputter deposited onto layer 17 to a thickness of 30 nm in the presence of a 20 Oe magnetization axis determination magnetic field aligned with the fields used in forming CoFe layers 15 and 17.

Post-deposition annealing of the finished superparamagnetic spin dependent tunneling junction material layers stack is done in an ambient atmosphere at a temperature of 250° C. for one hour in the presence of an applied magnetic field of 4000 Oe that is applied parallel to the previous magnetization axis determination fabrication magnetic fields. This annealing serves to enhance the magnetic "hardness" of the composite hard layer by enhancing the exchange coupling between its strata 17 and 18. The anneal also improves the quality of the tunnel barrier layer 14.

The wafer fabrication structure of a portion of a superparamagnetic spin dependent tunneling sensor shown in shown in layer diagram form in FIG. 5A must undergo further fabrication steps to complete the fabrication of useful magnetoresistive sensors therefrom in monolithic integrated circuit chips. The result of such a superparamagnetic spin dependent tunneling sensor fabrication process is shown in the layer diagram of FIG. 6. Prior to any etching of the wafer fabrication structure shown in FIG. 5A, a conductive 10 nm thick Al layer for forming buffer layer 19, a 10 nm thick CrSi layer to form etch stop layer 20, and 75 nm thick $Si_3N_4$ hard-mask layer (not shown, as it is subsequently removed) are deposited onto antiferromagnetic material layer 18 of the magnetically "hard" composite layer using sputter deposition. A photoresist mask is formed using standard photolithographic techniques on the surface of the hard-mask layer in the wafer chip fabrication structure which hard-mask is then etched using reactive ion etching (RIE). This etching removes unmasked portions of the hard-mask material down to the layer that will form etch stop layer 16. The photoresist mask is removed, and the resulting wafer chip fabrication structure is further etched in an ion mill to remove those portions thereof down to tunnel barrier 14 that are uncovered by the remaining portions of the hard-mask. Thus, top electrodes 21 are formed by the ion mill removing the unmasked material down to tunnel barrier 14, and also much of the 75 nm hard-mask layer from the areas previously masked thereby. The remnants of the silicon nitride hard-mask on the remaining portions of layer 20 and the now exposed portions of barrier layer 14 have a further silicon nitride layer sputter deposited thereon as a further hard-mask. Common bottom electrode 22 is then formed using a similar process to mask and etch the exposed portions of tunnel barrier 14, platelets or superparamagnetic material "layer" 12' providing the device free layer, and electrically conducting layer 11''' to stop on or within electrical insulating layer 11 to complete tunnel junction structure 23.

Tunnel junction structure top electrodes 21 and common bottom electrode 22 are passivated by sputter depositing electrical insulating passivation layer 24 of $Si_3N_4$ to a thickness of 100 nm. Contact window vias are formed in passivation layer 24 to expose portions of layers 20 using photolithography and RIE. Aluminum interconnections 25 are formed by sputter deposition of a 100 nm layer of Al onto passivating layer 24 and into windows exposing portions of layers 20 and subsequent patterning this layer into interconnections using photolithography and RIE. Thus, two tunnel junction structures 23 are formed each having a magnetically hard top electrode 21 as a pinned reference layer supported on barrier layer 14 supported in turn on common bottom electrode 22 so that they share this common bottom electrode having the free magnetic layer therein formed by platelets or superparamagnetic material "layer" 12'. Although having two top electrodes per bottom electrode it is not necessary, this arrangement provides for better use of physical space in the resulting chip it is not necessary to and an easier fabrication process.

At this point in the fabrication process, the magnetoresistive properties of the resulting superparamagnetic spin dependent tunneling devices as thus far completed can be tested so as to measure at least some of the tunnel junction structures 23 magnetic response properties and circuit performances. The tunneling current resistance between the two adjacent magnetic material layers in the electrodes on either side of insulating barrier layer 14 depends on the relative angle between the directions of the magnetizations in these two magnetic material layers. This resistance is relatively small when the two magnetizations are parallel, and relatively large when they are antiparallel. The compound magnetic material layer 15,16,17 in top electrode 21, typically formed using FeCo therein, has its magnetization direction pinned using antiferromagnetic layer 18, typically formed using CrPtMn, positioned immediately on or next to it. Under relatively small externally applied magnetic fields, less than several hundred Oe, this pinned layer magnetization direction changes little. Therefore, an electrical signal can be obtained between the two electrodes by manipulating the magnetization magnitude and direction of the free layer formed by platelets or superparamagnetic material "layer" 12'.

Additional layers must be deposited and patterned on the wafer chip fabrication structure having completed tunnel junction structures 23 therein to complete the desired superparamagnetic spin dependent tunneling device chips which may done in some instances so as enable them to provide selected special capabilities. Thus, electrical isolation barrier layer 26 of $Si_3N_4$ is typically sputter deposited over interconnections 25 and the exposed portions of passivation layer 24. Here, however, as an example of forming a chip with a special capability, the sensing of electrical current in a chip supported electrical conductor coil, electrical isolation barrier layer 26 is provided with a surface conditioner layer, 27, thereon to directly support thereon a 1.5 micron thick Al planar coil, 28. A second electrical isolation barrier layer, 29, separates coil 28 from a permalloy magnetic field shield, 30, provided on layer 29. Isolation barrier 26 is formed here to a thickness from 2 μm to 18 μm by performing the following sequence one or more times: spin-coating benzocyclobutene (BCB) over interconnections 25 and the exposed portions of passivation layer 24 followed by prescribed soft bake. The top surface of BCB isolation barrier 26 supports 500 nm of $Si_3N_4$ as surface conditioning layer 27 that is formed by sputter deposition. The thickness chosen for isolation barrier 26 is determined by the required standoff voltage between coil 28 and interconnections 25 along with tunnel junction structures 23 for a particular use of such a chip arrangement. A typical extreme requirement for an electrical isolation application is 2500 Volts standoff, for which 18 μm of BCB is required. More typical magnetic field sensor uses need only 50 Volts standoff or so. Planar coil 28 is formed by standard photolithography and RIE etching of a layer of 1.5 microns of sputter-deposited Al.

Figure 2:
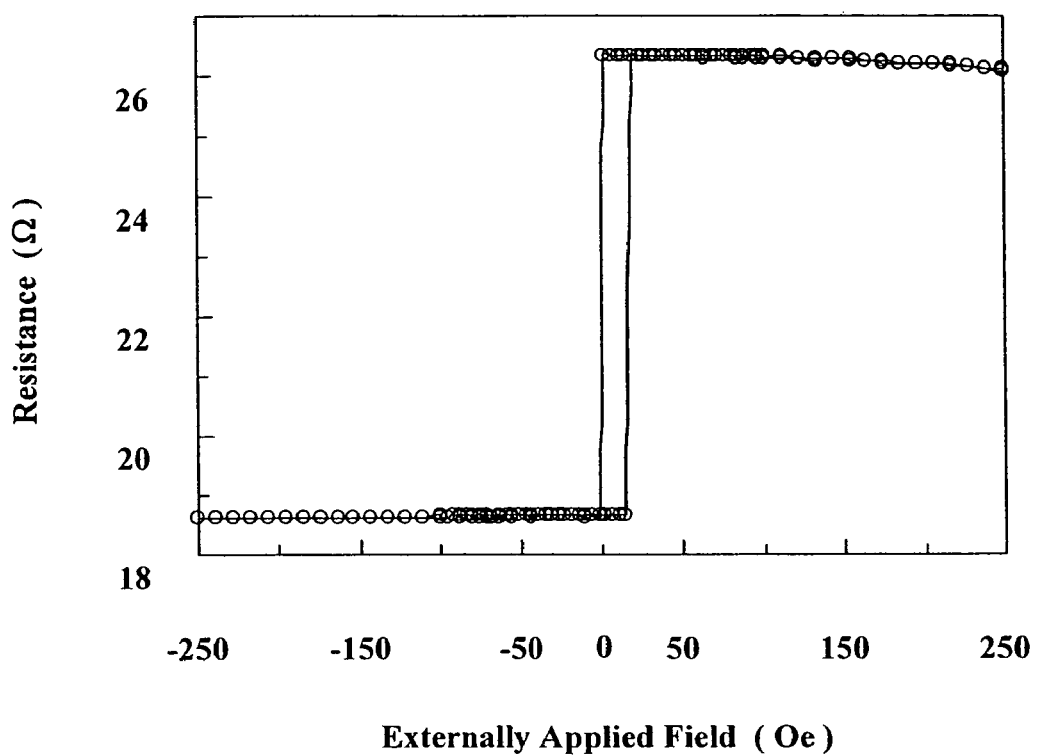
FIG. 2 shows a graph of a magnetoresistance vs. externally applied magnetic field characteristic for a conventional spin dependent tunneling device.
Figure 3:
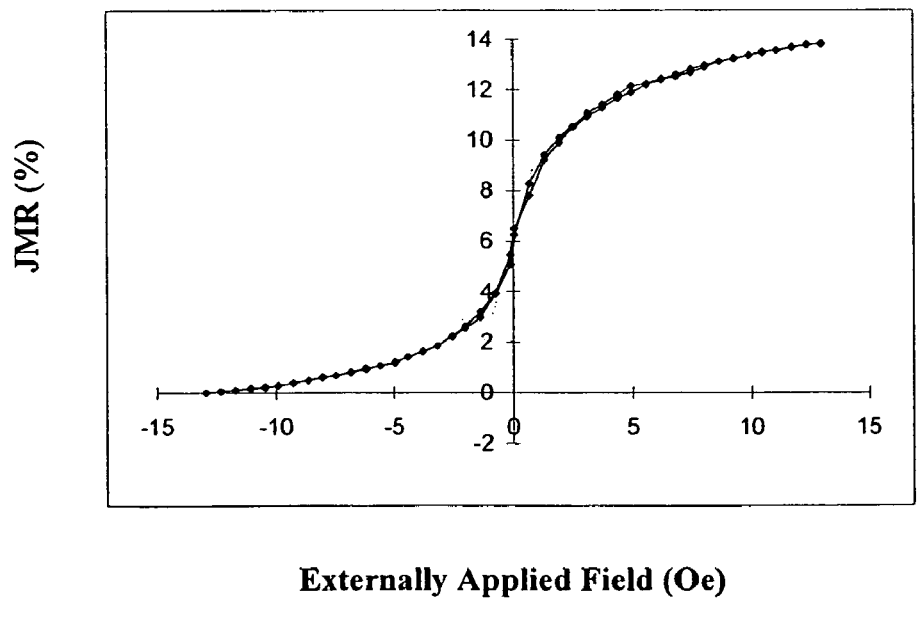
FIG. 3 shows a graph of a magnetoresistance vs. externally applied magnetic field characteristic for a biased conventional spin dependent tunneling device.
Figure 7:
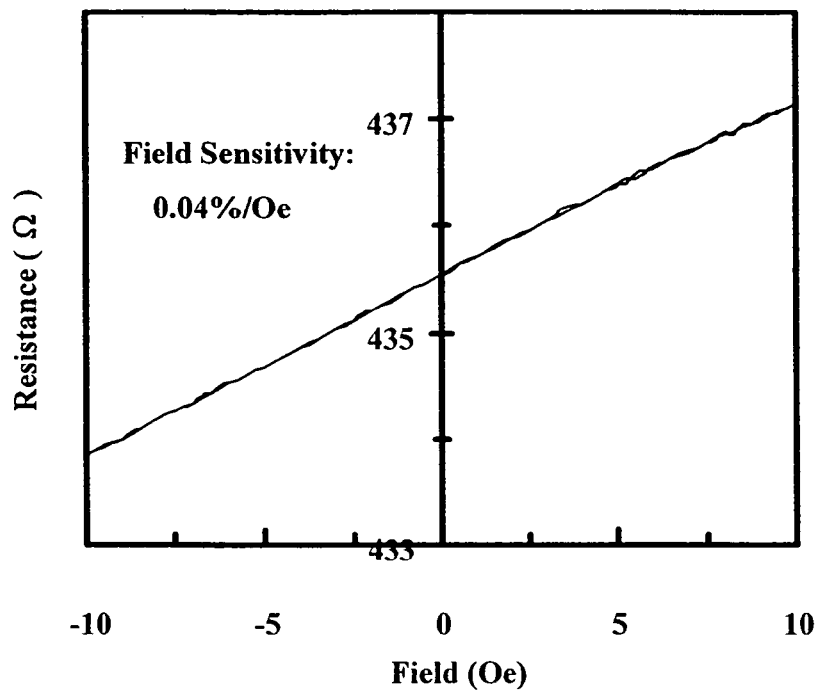
FIG. 7 shows a graph of a magnetoresistance vs. externally applied magnetic field characteristic for a device similar to the device of FIGS. 5A, 5B and 6.
Figure 8:
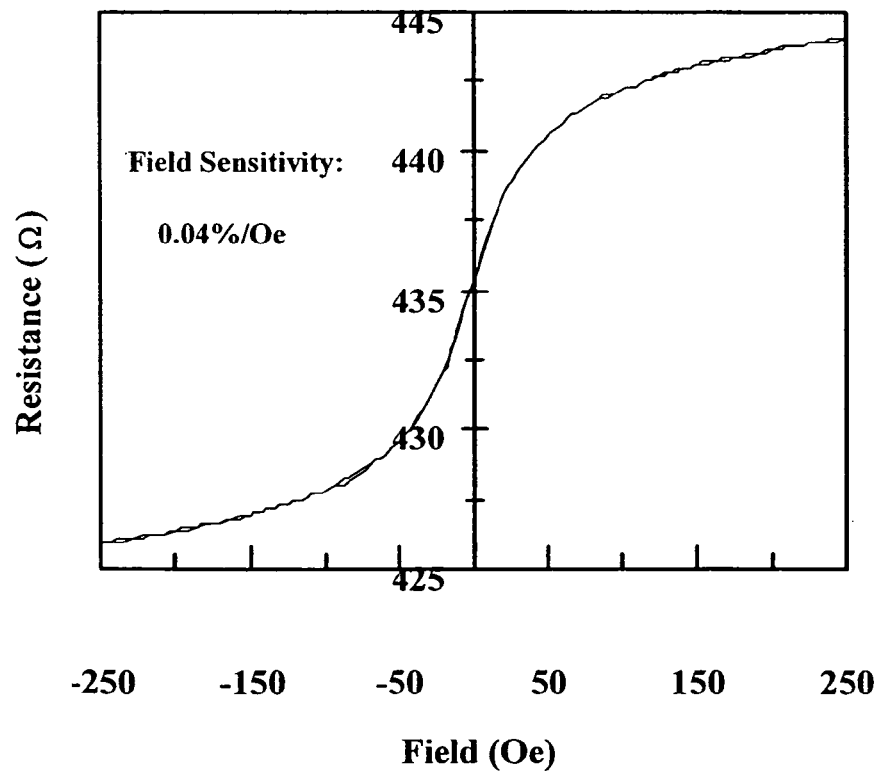
FIG. 8 shows a graph of a magnetoresistance vs. externally applied magnetic field characteristic for a device similar to the device of FIGS. 5A, 5B and 6.

As indicated above in connection with a conventional spin dependent tunneling device biased to provide a more linear, low hysteresis magnetoresistance characteristic as shown in FIG. 3, a major improvement would occur if the linear low hysteresis magnetoresistance characteristic could be obtained in some similar kind of device without needing a perpendicular bias field. Spin dependent tunneling devices of the nature just described having free layers formed of superparamagnetic platelets or layers can indeed have magnetoresistance characteristics exhibiting zero hysteresis. Such a response is shown in FIG. 7, a magnetoresistance vs. externally applied magnetic field characteristic graph of a superparamagnetic spin dependent tunneling device, i.e. a pinned reference spin dependent tunneling device having a superparamagnetic free layer, with no bias field used. FIG. 8 shows another magnetoresistance vs. externally applied magnetic field characteristic graph of the same superparamagnetic spin dependent tunneling device having the characteristic shown in FIG. 7, but with a larger range of externally applied magnetic fields. Again, zero hysteresis is present. In these characteristics the sensitivity to externally applied magnetic fields is not very high which likely due to a low KV/kT ratio in the device free layer. The magnetoresistance vs. externally applied magnetic field characteristics shown in FIGS. 7 and 8 are in drastic contrast to magnetoresistance vs. externally applied magnetic field characteristics of a pinned reference spin dependent tunneling device having an ordinary ferromagnetic thin-film free layer as were shown in FIGS. 2 and 3 where a large hysteresis exists alterable toward zero only by use of a large bias magnetic field.

Figure 9:
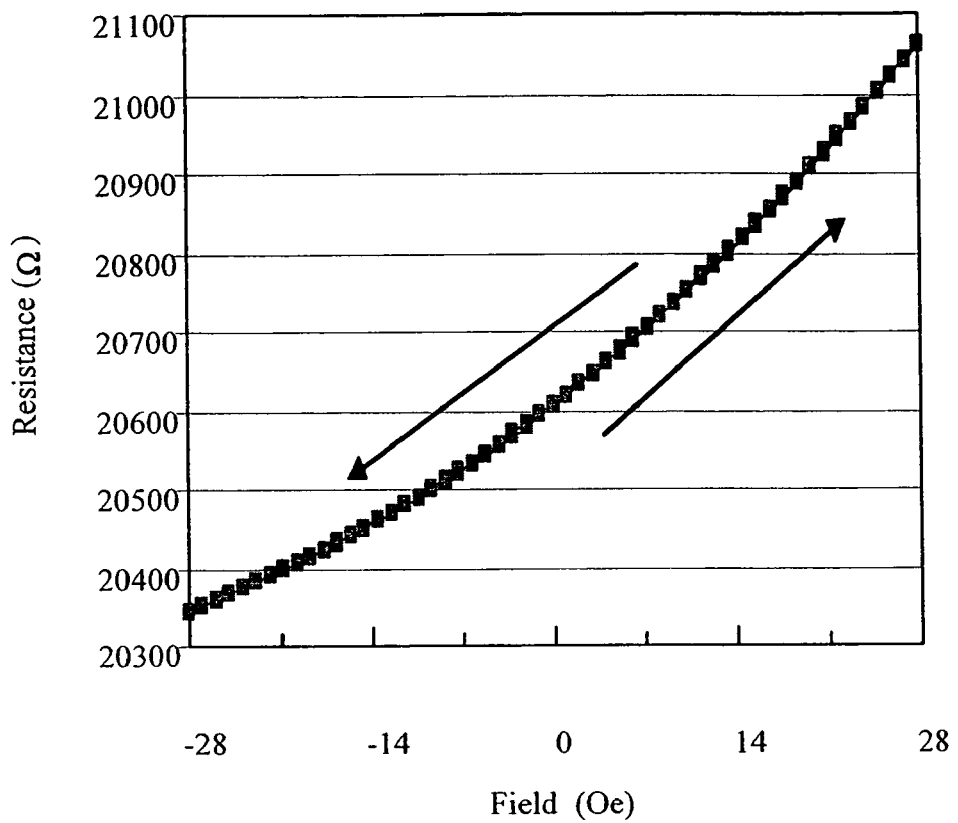
FIG. 9 shows a graph of a magnetoresistance vs. externally applied magnetic field characteristic for a device similar to the device of FIGS. 5A, 5B and 6.
Figure 10:
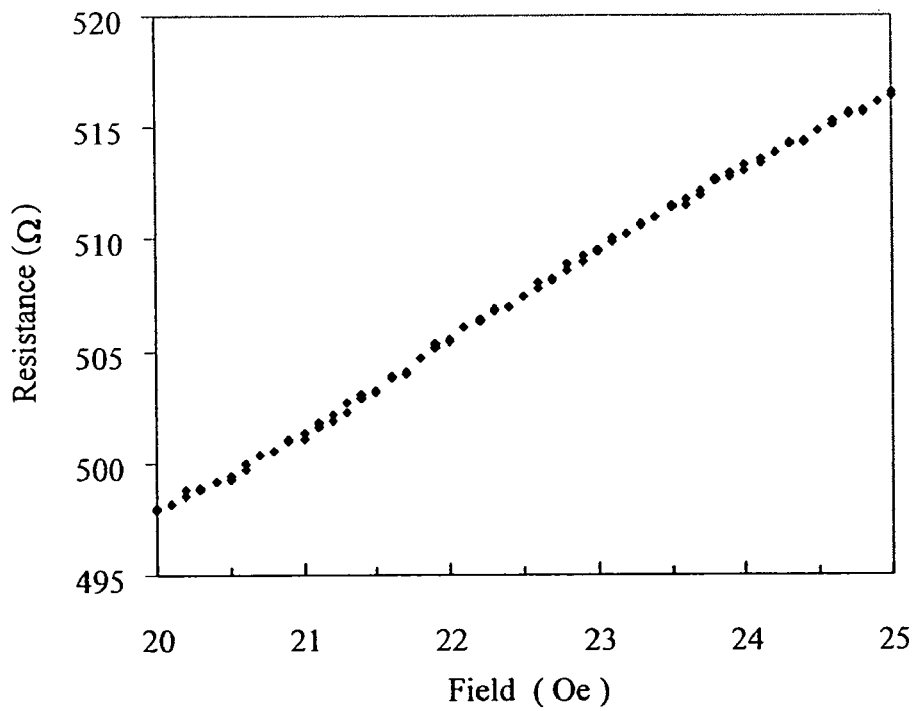
FIG. 10 shows a graph of a magnetoresistance vs. externally applied magnetic field characteristic for a device similar to the device of FIGS. 5A, 5B and 6.
Figure 11:
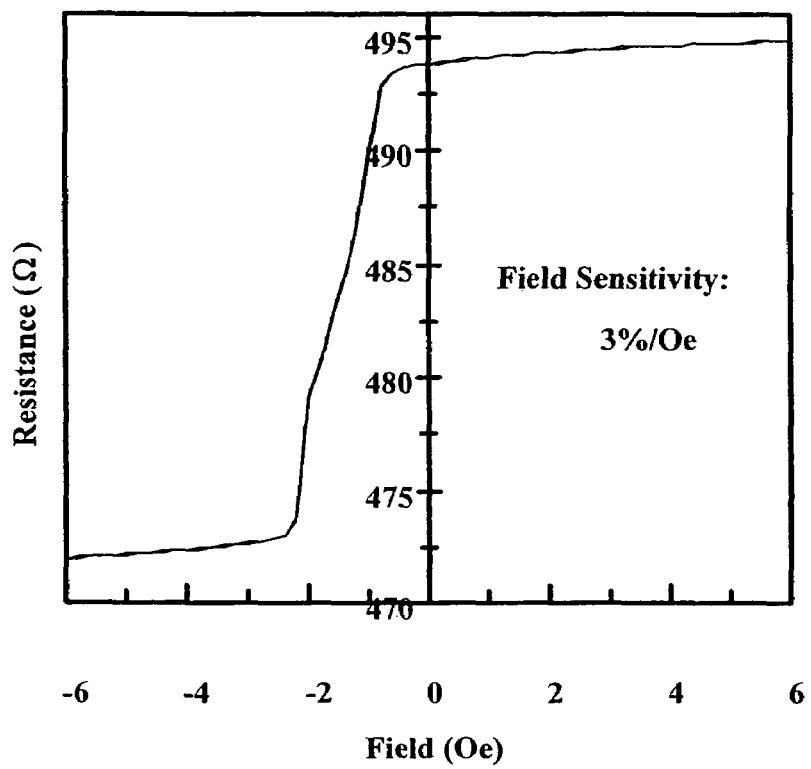
FIG. 11 shows a graph of a magnetoresistance vs. externally applied magnetic field characteristic for a device similar to the device of FIGS. 5A, 5B and 6.
Figure 12:
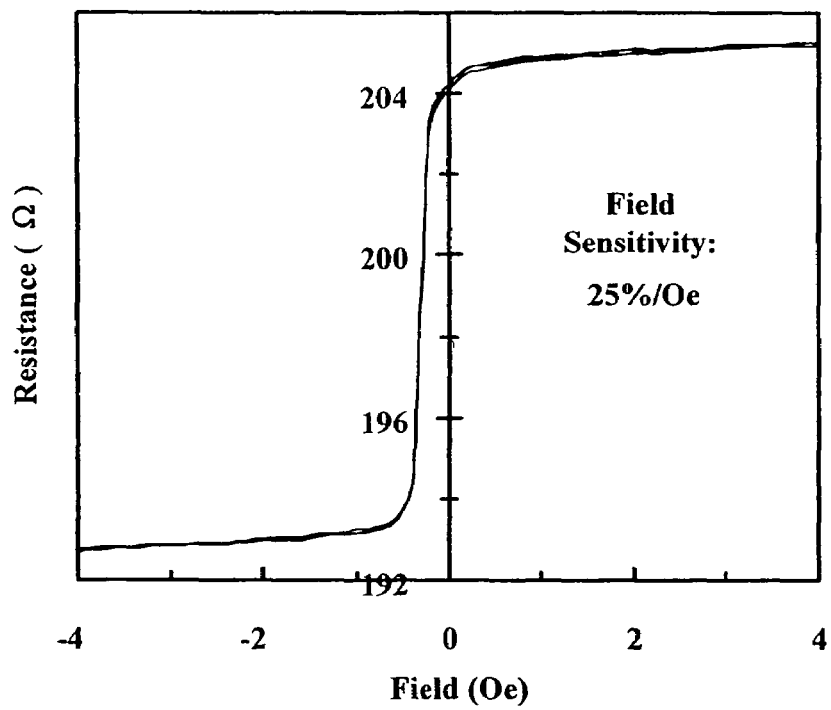
FIG. 12 shows a graph of a magnetoresistance vs. externally applied magnetic field characteristic for a device similar to the device of FIGS. 5A, 5B and 6.
Figure 13:
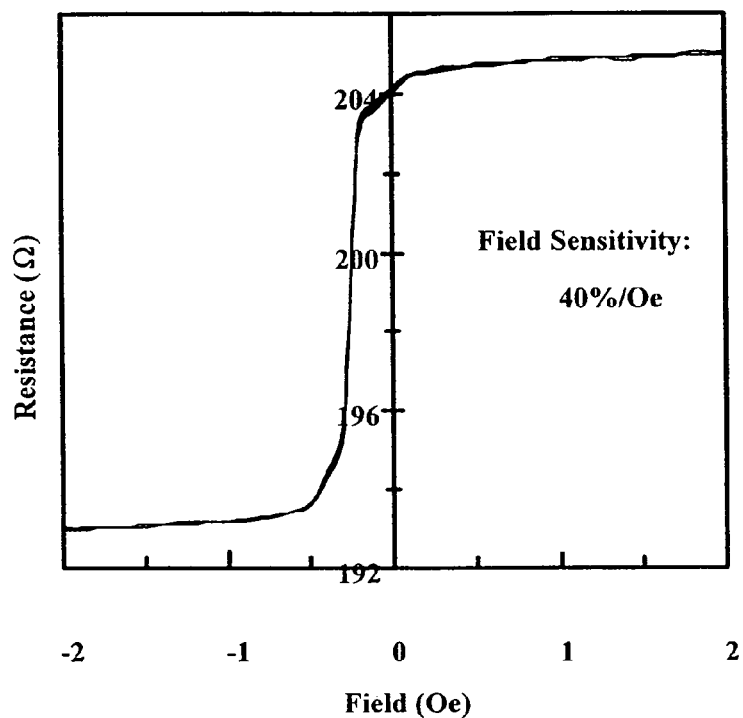
FIG. 13 shows a graph of a magnetoresistance vs. externally applied magnetic field characteristic for a device similar to the device of FIGS. 5A, 5B and 6.

FIGS. 7 through 13 all show magnetoresistance vs. externally applied magnetic field characteristics graphs for superparamagnetic spin dependent tunneling devices with similar layer construction to the structure described above. FIG. 9 shows a device with a field sensitivity of 0.06%/Oe. FIG. 10 shows a device with a field sensitivity of 0.76%/Oe. FIG. 11 shows a device with a field sensitivity of 3%/Oe. FIG. 12 shows a device with a field sensitivity of 25%/Oe. FIG. 13 shows a device with a field sensitivity of 40%/Oe. This wide range of externally applied magnetic field sensitivities is indicative of the varying KV/kT ratios that can be provided in the platelets or superparamagnetic layer as free layers in these devices.

Figures 14A, 14B, 14C, 14D:
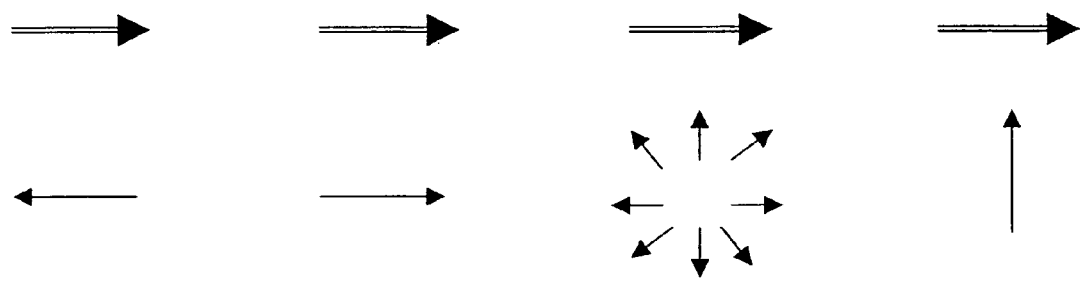
FIG. 14 shows a representation of device magnetizations for a device similar to the device of FIGS. 5A, 5B and 6.

For a superparamagnetic spin dependent tunneling device having platelets or superparamagnetic layer as the device free layer across the barrier layer from a regular pinned magnetization direction reference layer, the tunnel junction resistance is the highest when an externally applied magnetic field aligns the free layer magnetization (represented by a single shaft arrow) antiparallel to the reference direction (represented by a double shaft arrow) as is shown in FIG. 14A, and is the lowest when this applied field is reversed in direction as is shown in FIG. 14B. The value of this magnetic field dependent resistance of the junction is halfway between these extremes for a zero value externally applied magnetic field because of the random distribution of the magnetizations of the platelets in the superparamagnetic "layer" serving as the device free layer as shown in FIG. 14C. This resistance is exactly the same as when the free layer magnetization is saturated perpendicular to the pinned layer direction by a similarly directed externally applied magnetic field as shown in FIG. 14D. Thus, externally applied magnetic fields that are applied along a direction perpendicular to the reference direction do not affect the resistance value of such a superparamagnetic spin dependent tunneling device, and only changes in externally applied fields parallel to the reference direction, i.e. the sense axis, result in changes in the resistance magnitude. These device characteristics are ideal for directional sensing uses.

"Orange Peel" magnetic coupling occurring between protrusions from surfaces of deposited magnetic material layers in spin dependent tunneling devices that are unavoidably not flat is smaller in superparamagnetic spin dependent tunneling devices than it is in conventional spin dependent tunneling devices because of the thinness of the free layers in the former as is required for the platelets forming such layers to be superparamagnetic. A reduction of the pinned layer thickness in a single pinned layer device or the use of synthetic antiferromagnetic layer as described above will further reduce such "Orange Peel" coupling as well as fringing fields.

In general, spin dependent tunneling devices have the advantages of 1) higher externally applied magnetic field sensitivity, 2) lower device power consumption, and 3) smaller size. The significant improvements due to using a superparamagnetic material free layer increases all three of these advantages. Additional advantages due to using a superparamagnetic material free layer include a) no magnetic field bias being required to linearize the sensor magnetoresistance versus external applied field characteristic, and b) the magnetization orientation of the free layer more truly following the orientation of an externally applied magnetic field because of no magnetic anisotropy being present.

There are several further uses for superparamagnetic materials in other magnetic circuit devices. Superparamagnetic platelets or layers can be incorporated into anisotropic magnetoresistive response devices and "giant magnetoresistive" response devices including, in spin valve or pseudo spin valve versions, as the free layer. The total signal for such devices may suffer from the use of a very thin superparamagnetic platelets or layer because that layer is much thinner than the mean free path for spin scattering. However, this thickness is enough to sustain the full JMR for a spin dependent tunneling device as described above because it is the spin dependent tunneling probability that dominates the JMR in these devices rather than the spin scattering in the magnetic layers that is dominant in these other devices. Therefore, the JMR value of a spin dependent tunneling device is affected little. A 3-D superparamagnetic body can be used in a traditional fluxgate to take advantage of the resulting high sensitivity and zero hysteresis. Superparamagnetic spin dependent tunneling devices can be beneficially used in solid state compasses, magnetic signature land mine detection, fusing control of explosive projectiles, magnetic media detection, electrical current detection, and other small magnetic field sensing uses such as are encountered in nondestructive metal structure evaluation, biomedical sensing, geology surveying, and the like.

A typical superparamagnetic spin dependent tunneling device sensor has a bridge circuit of four superparamagnetic spin dependent tunneling device magnetoresistors and associated operating electronics. As indicated above, multiple superparamagnetic spin dependent tunneling device magnetoresistors can be electrically connected in series to form a resistance "leg" for such a bridge circuit that can have a higher total voltage applied across it than can a single such magnetoresistor or a pair thereof. This series interconnection of these magnetoresistors is often done in circuits where the supply voltage is much higher than the 100 mV that is safe to put across the tunnel junction of a single magnetoresistor.

Figure 15:
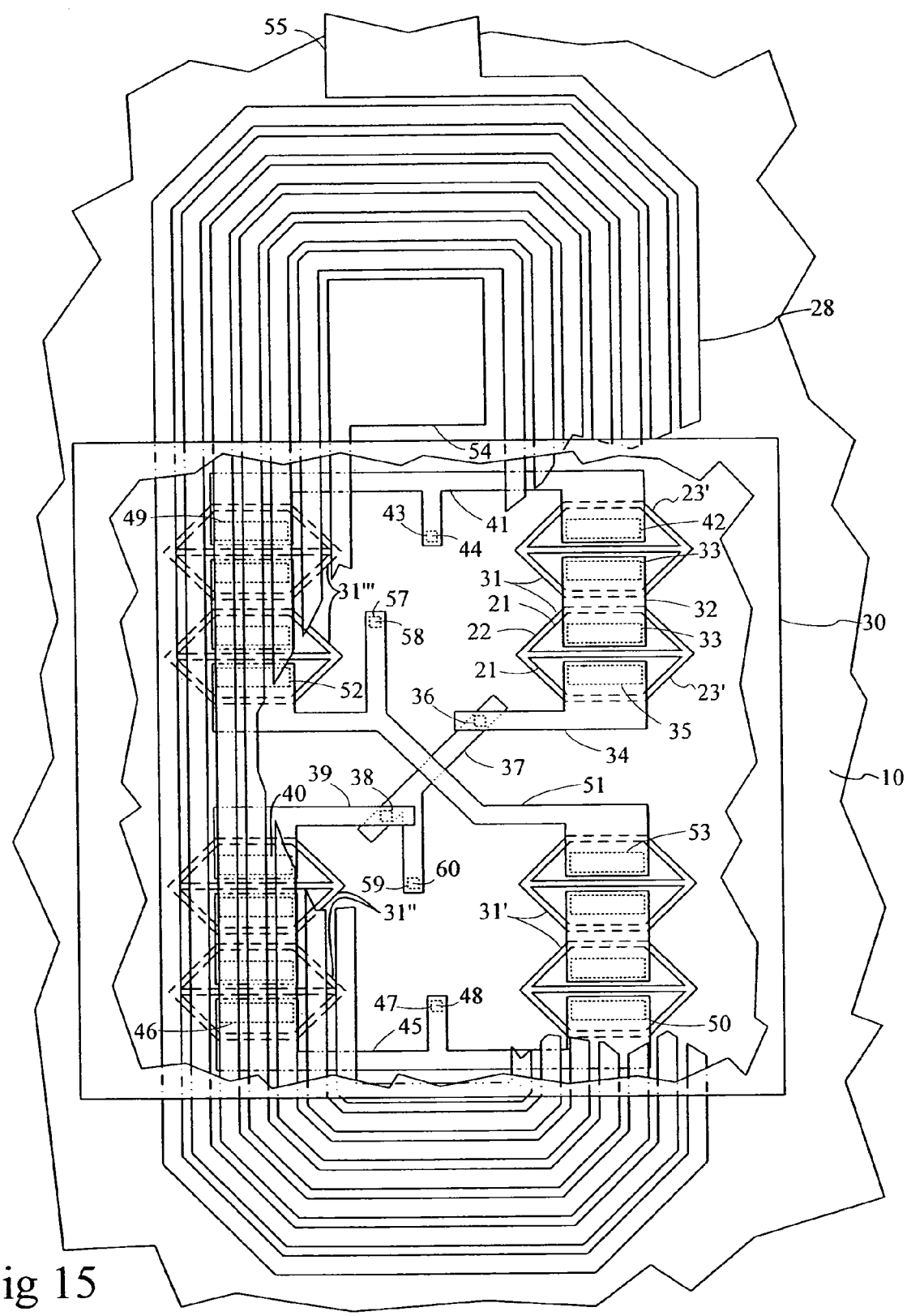
FIG. 15 shows a top view of a monolithic integrated circuit chip comprising a magnetoresistive signal isolator.
Figure 16:
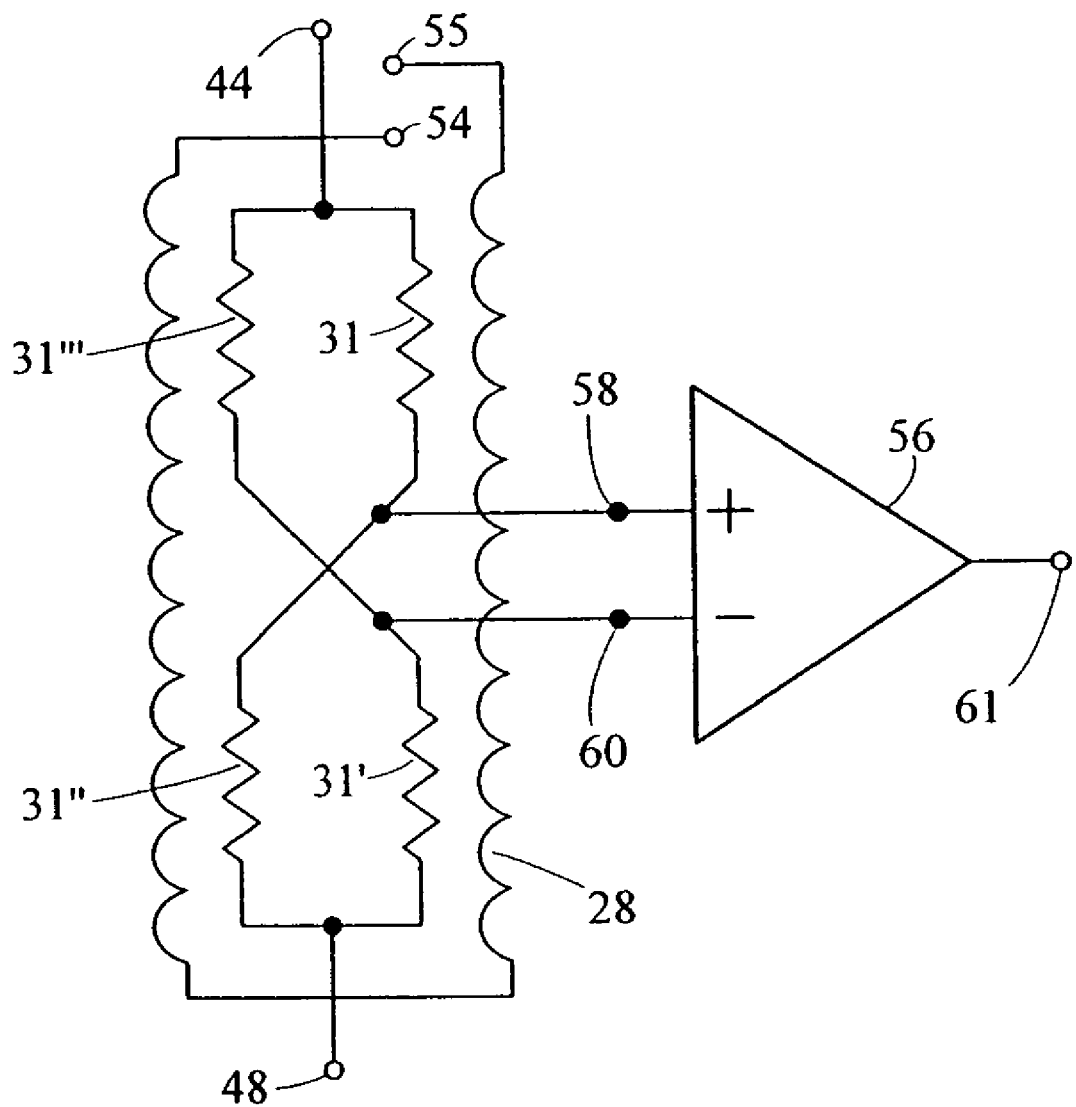
FIG. 16 shows a circuit schematic diagram for a portion of the monolithic integrated circuit of FIG. 15.

FIG. 15 shows a top view of a monolithic integrated circuit based magnetoresistive signal isolator based on use of a bridge circuit with superparamagnetic spin dependent tunneling device magnetoresistors. FIG. 16 shows a simple schematic of the bridge circuit plus an output signal amplifier arrangement connected to this bridge circuit. In the simplest form, the electronic amplifier circuit is formed by a comparator having an input that receives output signals from this bridge circuit. In actual circuits, there are often additional functions in the operating electronic circuits, such as amplification, feedback, parallel and perpendicular biasing, filtering, chopping, stabilization, voltage modulation etc. depending on the specific uses intended.

Figure 6:
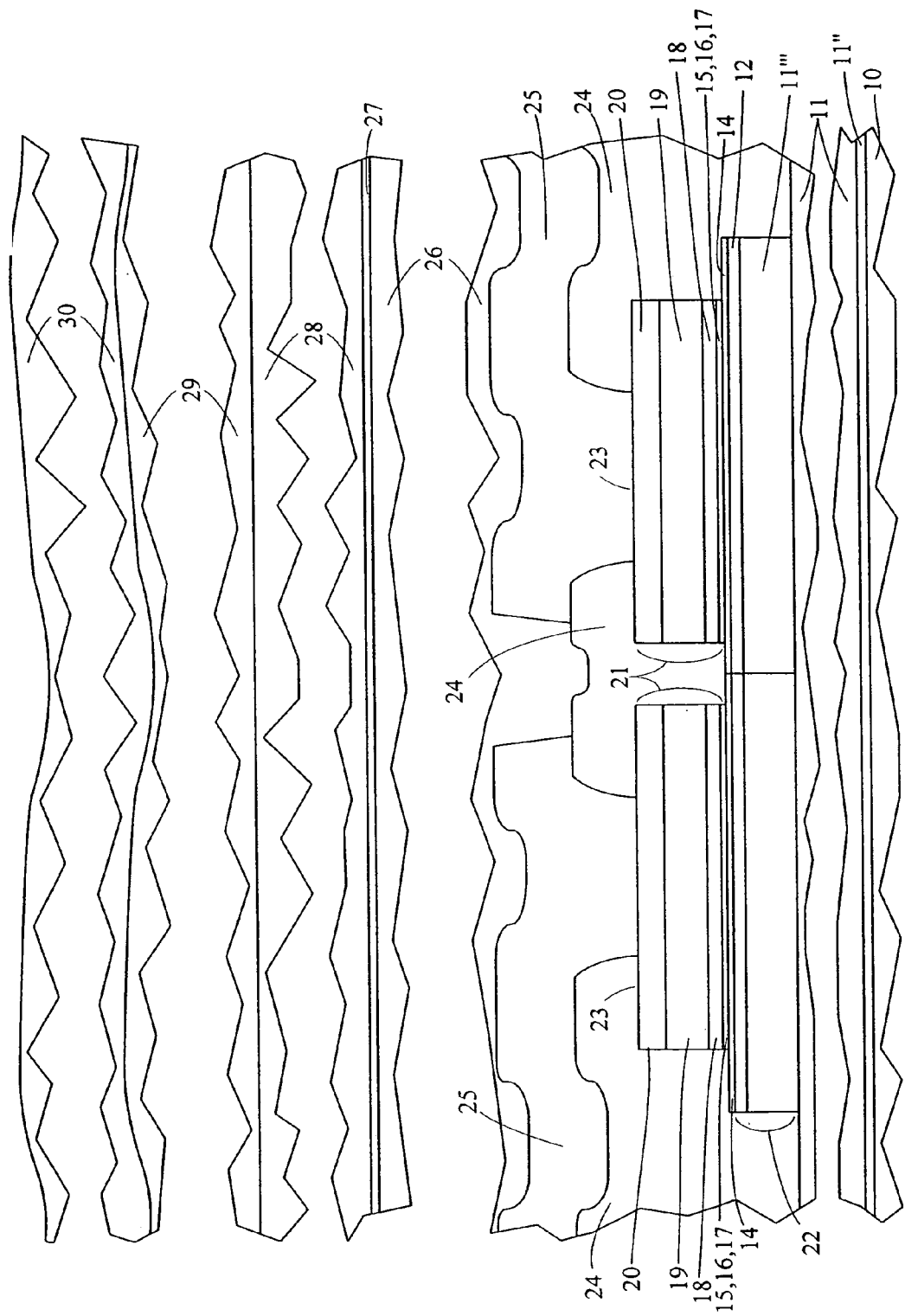
FIG. 6 shows a layer diagram of a larger portion of the device of FIG. 5A including the portion shown in that figure.

From FIG. 6, each of the two upper electrodes 21 supported on barrier layer 14, which in turn is supported on common bottom electrode 22, form a corresponding tunnel junction structure 23 in that figure, and in FIG. 15, to thereby together form junction pair, 23', as shown in FIG. 15. Two such junction pairs together form bridge leg, 31, in FIGS. 15 and 16 which thus contains two junction pairs 23' interconnected in series using a metal interconnection, 32, through two vias, 33, so as to thereby provide four total tunnel junction structures 23 therein as shown in FIG. 15. Four such bridge legs, 31, 31', 31", and 31''', are electrically interconnected together as shown in FIGS. 15 and 16.

One such interconnection in FIG. 15 extends from one end of bridge leg 31 to one end of bridge leg 31". This is accomplished using an upper level interconnection, 34, (FIG. 6 shows only one level of metal interconnections in forming the devices shown there but multiple levels of metal interconnections are commonly provided in fabricating such monolithic integrated circuit structures). Interconnection 34 is connected at one end thereof down through a via, 35, provided in the insulating layer separating the upper and lower levels of metal interconnections and in the insulating layer separating the lower level of metal interconnections from the bridge legs, to one end of bridge leg 31, and is connected at the other end thereof down through a via, 36, in the insulating layer separating the upper and lower levels of metal interconnections to one end of a lower level interconnection, 37. Lower level interconnection 37 is connected at the other end thereof up through a via, 38, through the same insulating layer to one end of another upper level interconnection, 39. Upper level interconnection 39 is connected at the other end thereof down through a via, 40, through the aforementioned two insulating layers to one end of bridge leg 31".

Similarly, another upper level interconnection, 41, is connected at one end thereof down through a via, 42, provided in the insulating layer separating the upper and lower levels of metal interconnections and in the insulating layer separating the lower level of metal interconnections from the bridge legs, to the other end of bridge leg 31. The other end of interconnection 41 is connected down through a via, 43, provided through the various insulating layers over monolithic integrated circuit chip 10 to a power supply circuit terminal region, 44, in that integrated circuitry. In the same manner, another upper level interconnection, 45, is connected at one end thereof down through a via, 46, provided in the insulating layer separating the upper and lower levels of metal interconnections and in the insulating layer separating the lower level of metal interconnections from the bridge legs, to the other end of bridge leg 31". The other end of interconnection 45 is connected down through a via, 47, provided through the various insulating layers over monolithic integrated circuit chip 10 to a power supply circuit terminal region, 48, in that integrated circuitry.

Interconnection 41, through a via, 49, provided in the insulating layer separating the upper and lower levels of metal interconnections and in the insulating layer separating the lower level of metal interconnections from the bridge legs, also interconnects one end of bridge leg 31''' to power supply circuit terminal region 44. Again, interconnection 45, through a via, 50, provided in the insulating layer separating the upper and lower levels of metal interconnections and in the insulating layer separating the lower level of metal interconnections from the bridge legs, also interconnects one end of bridge leg 31' to power supply circuit terminal region 48. The opposite ends of bridge legs 31' and 31''' are connected together by a further upper level interconnection, 51, down through a via, 52, at one end thereof to the other end of bridge leg 31''' and down through a via, 53, at the other end thereof to the other end of bridge leg 31', with both of these vias provided in the insulating layer separating the upper and lower levels of metal interconnections and in the insulating layer separating the lower level of metal interconnections from the bridge legs.

Monolithic integrated circuit chip substrate 10 supports this bridge circuit. Portions of magnetic shield 30 and coil 28 from FIG. 6 are cut away in FIG. 15 to more fully reveal structures therebelow. Also, the various dielectric layers are shown as being transparent except for the top of integrated circuit chip substrate 10.

The function of such an isolator structure is to perform is the passing of information, carried in electrical current established in coil 28, to the bridge circuit at its magnetoresistors without having a direct electrical interconnection between that circuit and the coil. The magnetoresistors based signal isolator of FIGS. 15 and 16 performs this function by conducting an information bearing electric current signals that is provided at a pair of coil inputs, 54 and 55, of coil 28 past the bridge circuit so that the magnetic fields resulting from these currents are converted to an electrical signal by the this bridge circuit and its associated operating circuitry. The input signal current through coil 28 generates magnetic fields in a direction over bridge legs 31 and 31' that is concurrently antiparallel to the direction of the magnetic fields over bridge legs 31" and 31''' generated by that same current. Due to the asymmetric nature of the superparamagnetic spin dependent tunneling devices magnetoresistance vs. externally applied magnetic field characteristics (as shown in FIGS. 7 through 13), the resistances of bridge legs 31 and 31' for one direction of current through coil 28 will be greater than they are at a zero current value while the resistances of bridge legs 31" and 31''' will be lower than they are at a zero current value, and vice versa for the opposite current direction. This resistance difference in the otherwise balanced bridge legs results in an output voltage from the bridge circuit. This output voltage is a linear, non-hysteretic function of the coil input current because the magnetoresistance vs. externally applied magnetic field characteristics of the superparamagnetic spin dependent tunneling devices in the bridge legs are highly linear and non-hysteretic.

As described above and shown in FIG. 15, vias 43 and 47 contain metal interconnections to the integrated circuitry below in monolithic integrated circuit chip 10. These metal interconnections connect the bridge circuit to positive power supply circuit terminal region 44 and negative power supply circuit terminal region 48, respectively, of an appropriate voltage or current source provided in that integrate circuitry as indicated in FIG. 16. The output voltage signal from the bridge circuit must also be provided to that integrated circuitry, and is typically first provided to the inputs of a differential amplifier or comparator, 56, in that integrated circuitry. Thus, lower level interconnection 37 in the bridge circuit is also connected to that integrated circuitry by a metal interconnection through a further via, 57, provided through the various insulating layers over monolithic integrated circuit chip 10 to a noninverting input, 58, of differential amplifier or comparator 56. Similarly, upper level interconnection 51 in the bridge circuit is also connected to that integrated circuitry by a metal interconnection through a further via, 59, provided through the various insulating layers over monolithic integrated circuit chip 10 to an inverting input, 60, of differential amplifier or comparator 56. The amplified versions of the output voltage signals from the bridge circuit provided by differential amplifier 56, or the voltage states assigned to the output voltage signals from the bridge circuit if this amplifier is instead a comparator, are available at the amplifier or comparator output terminal region, 61.

Although the present invention has been described with reference to preferred embodiments, workers skilled in the art will recognize that changes may be made in form and detail without departing from the spirit and scope of the invention.

The invention claimed is:

1. A ferromagnetic thin-film based magnetic field sensor, said sensor comprising:

a substrate;

an electrically insulative intermediate layer supported on said substrate, said intermediate layer having two major surfaces on opposite sides thereof;

an initial thin-film of an anisotropic ferromagnetic material on one of said intermediate layer major surfaces; and a plurality of separated thin-film platelets against that remaining one of said intermediate layer major surfaces across from said initial thin-film each of a ferromagnetic material that is less than 20 Å thick.

2. The sensor of claim 1 wherein said plurality of separated thin-film platelets together have a length along a selected direction and a width that is smaller in extent than said length and wherein said plurality of separated thin-film platelets are each positioned so as together to have a shaped end portion extending over a portion of said length in which said width gradually reduces to zero at an end thereof.

3. The sensor of claim 2 wherein said initial thin-film has a length along a selected direction and a width that is smaller in extent than said length and has a shaped end portion extending over a portion of said length in which said width gradually reduces to zero at an end thereof.

4. The sensor of claim 1 wherein said initial thin-film and said plurality of separated thin-film platelets have magnetizations which each rotate to a differing angle for a selected external magnetic field being present thereat.

5. The sensor of claim 4 wherein said initial thin-film has provided thereon a magnetization direction fixing structure comprising an antiferromagnetic material.

6. The sensor of claim 1 further comprising a substantially planar coil spaced apart from said sensor.

7. The sensor of claim 6 further comprising a permeable mass serving as a magnetic field concentrator therefor spaced apart from said sensor and said substantially planar coil.

8. The sensor of claim 1 further comprising a permeable mass serving as a magnetic field concentrator therefor spaced apart from said sensor.

9. The sensor of claim 1 further comprising a plurality of sensors similar to, and including, said sensor provided in a bridge circuit.

10. The sensor of claim 1 wherein said plurality of separated thin-film platelets are of a material comprising nickel and iron.

11. The sensor of claim 10 wherein said plurality of separated thin-film platelets are of a material further comprising cobalt.

12. The sensor of claim 11 wherein said plurality of separated thin-film platelets are each in contact with a material comprising ruthenium.

13. The sensor of claim 12 wherein said intermediate layer is of a material comprising aluminum oxide.

14. The sensor of claim 11 wherein said intermediate layer is of a material comprising aluminum oxide.

15. The sensor of claim 10 wherein said plurality of separated thin-film platelets are each in contact with a material comprising ruthenium.

16. The sensor of claim 15 wherein said intermediate layer is of a material comprising aluminum oxide.

17. The sensor of claim 1 wherein said intermediate layer is of a material comprising aluminum oxide.

18. The sensor of claim 10 wherein said intermediate layer is of a material comprising aluminum oxide.

* * * * *